(12) United States Patent
Hsieh et al.

(10) Patent No.: US 11,764,229 B2
(45) Date of Patent: Sep. 19, 2023

(54) PIXEL ARRAY SUBSTRATE

(71) Applicant: Au Optronics Corporation, Hsinchu (TW)

(72) Inventors: Hsiu-Chun Hsieh, Hsinchu (TW);
Hsin-Hung Sung, Hsinchu (TW);
Shu-Hui Huang, Hsinchu (TW);
Chih-Chung Su, Hsinchu (TW);
Yi-Wei Chen, Hsinchu (TW);
Fang-Hui Chan, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 316 days.

(21) Appl. No.: 17/359,649

(22) Filed: Jun. 28, 2021

(65) Prior Publication Data
US 2022/0165755 A1    May 26, 2022

(30) Foreign Application Priority Data
Nov. 20, 2020 (TW) ................................ 109140819

(51) Int. Cl.
*H01L 27/12* (2006.01)
*H01L 25/16* (2023.01)

(52) U.S. Cl.
CPC .......... *H01L 27/124* (2013.01); *H01L 25/167* (2013.01)

(58) Field of Classification Search
CPC ..... H01L 27/124; H01L 25/167; H01L 33/62; H01L 25/0753; G02F 1/136286
See application file for complete search history.

(56) References Cited

U.S. PATENT DOCUMENTS

| | | |
|---|---|---|
| 2005/0041191 A1 | 2/2005 | Lim |
| 2006/0103412 A1 | 5/2006 | Kimura et al. |
| 2015/0163942 A1 | 6/2015 | Wu |
| 2019/0157248 A1 | 5/2019 | Lee et al. |
| 2020/0066693 A1 | 2/2020 | Kim et al. |
| 2020/0312883 A1 | 10/2020 | Qu et al. |
| 2021/0118968 A1* | 4/2021 | Lee ................. H01L 27/124 |

FOREIGN PATENT DOCUMENTS

| | | |
|---|---|---|
| CN | 103680337 | 3/2014 |
| CN | 109585462 | 4/2019 |
| CN | 109950226 | 6/2019 |
| TW | 200638143 | 11/2006 |
| TW | 201523107 | 6/2015 |

* cited by examiner

*Primary Examiner* — James A Dudek
(74) *Attorney, Agent, or Firm* — JCIPRNET

(57) ABSTRACT

A pixel array substrate, including a substrate, multiple conductors, a pixel driving circuit, a first pad, and a second pad, is provided. The substrate has a first surface, a second surface, and multiple through holes. The through holes extend from the first surface to the second surface. The conductors are respectively disposed in the through holes. The pixel driving circuit is disposed on the first surface of the substrate. The first pad and the second pad are disposed on the second surface of the substrate. The conductors include a first conductor, a second conductor, and a first dummy conductor. The first conductor is electrically connected to the pixel driving circuit and the first pad. The second conductor is electrically connected to the pixel driving circuit and the second pad. The first dummy conductor is overlapped with and electrically isolated from the pixel driving circuit.

20 Claims, 14 Drawing Sheets

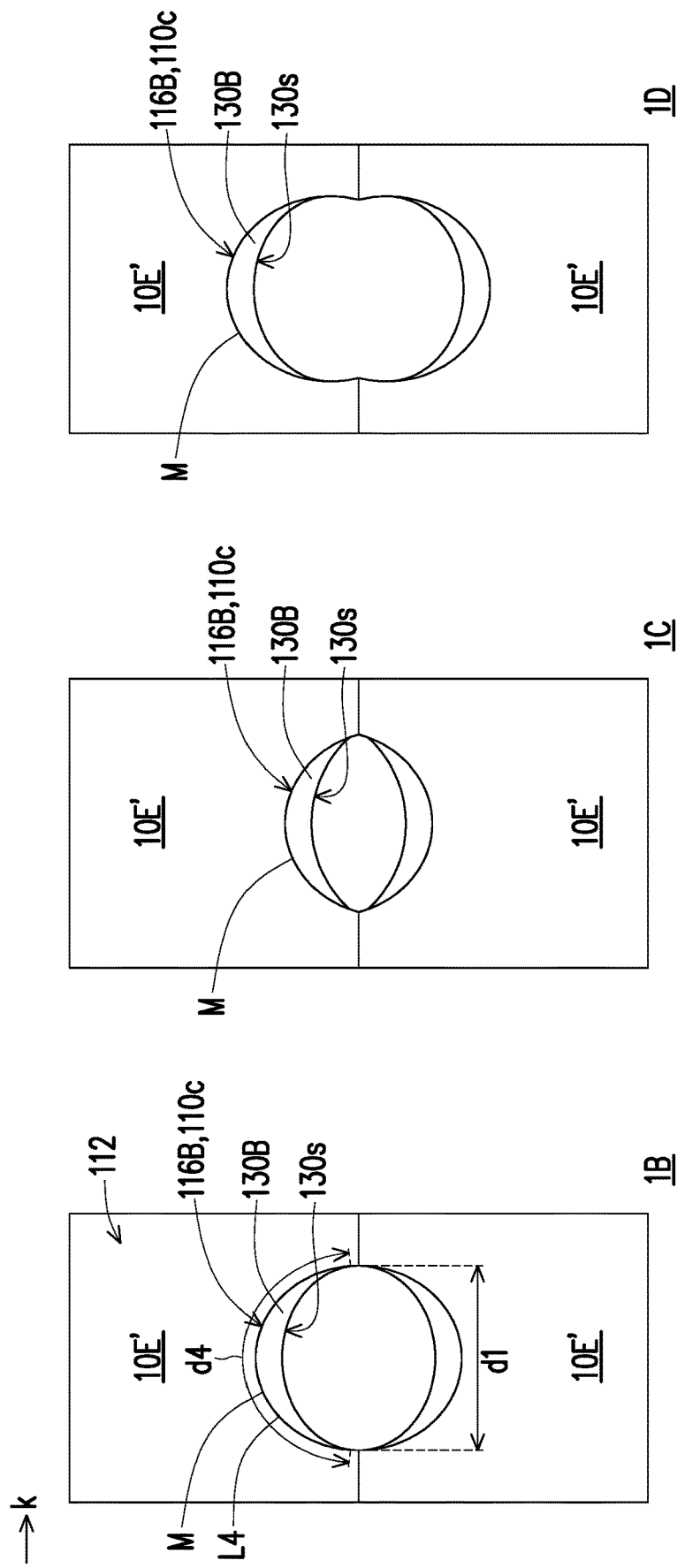

PIXEL ARRAY SUBSTRATE

CROSS-REFERENCE TO RELATED APPLICATION

This application claims the priority benefit of Taiwan application serial no. 109140819, filed on Nov. 20, 2020. The entirety of the above-mentioned patent application is hereby incorporated by reference herein and made a part of this specification.

BACKGROUND

Technical Field

The disclosure relates to a pixel array substrate.

Description of Related Art

The light-emitting diode display panel includes an active element substrate and multiple light-emitting diode elements transferred to the active element substrate. Inheriting the characteristics of light-emitting diodes, the light-emitting diode display panel has the advantages of power saving, high efficiency, high brightness, fast response time, etc. In addition, compared to the organic light-emitting diode display panel, the light-emitting diode display panel also has advantages such as easy color adjustment, long light-emitting lifespan, and no image burn-in. Therefore, the light-emitting diode display panel is regarded as the next generation display technology.

However, the pixel driving circuit and the light-emitting diode elements need to be disposed on the same surface of the light-emitting diode display panel, which easily causes the issue of insufficient layout area. In addition, in order to implement a light-emitting diode display panel with a narrow bezel or even bezel-less, conductors are disposed on the sidewall of the substrate of the light-emitting diode display panel. When multiple light-emitting diode display panels are spliced into a spliced display device with a narrow seam or even seamless, the conductors on the sidewalls of adjacent light-emitting diode display panels are likely to come into contact, which causes short circuit.

SUMMARY

The disclosure provides a pixel array substrate with good performance.

The pixel array substrate of the disclosure includes a substrate, multiple conductors, a pixel driving circuit, a first pad, and a second pad. The substrate has a first surface, a second surface, and multiple through holes. The first surface is opposite to the second surface. The multiple through holes extend from the first surface to the second surface. The conductors are respectively disposed in the through holes. The pixel driving circuit is disposed on the first surface of the substrate. The first pad and the second pad are disposed on the second surface of the substrate. The conductors include at least one first conductor, a second conductor, and a first dummy conductor. The at least one first conductor is electrically connected to the pixel driving circuit and the first pad. The second conductor is electrically connected to the pixel driving circuit and the second pad. The first dummy conductor overlaps with and is electrically isolated from the pixel driving circuit.

In an embodiment of the disclosure, the pixel driving circuit includes a thin film transistor. The first dummy conductor overlaps with a channel of the thin film transistor.

In an embodiment of the disclosure, the pixel array substrate further includes a first dielectric layer, which is disposed between the thin film transistor and the first surface of the substrate. The first dielectric layer has a contact window, which overlaps with the at least one first conductor. A first terminal of the thin film transistor is electrically connected to at least one first conductor through the contact window. A physical portion of the first dielectric layer is disposed between the channel of the thin film transistor and the first dummy conductor.

In an embodiment of the disclosure, the pixel driving circuit includes a thin film transistor. The first dummy conductor overlaps with a control terminal of the thin film transistor.

In an embodiment of the disclosure, the pixel array substrate further includes a first dielectric layer, which is disposed between the thin film transistor and the first surface of the substrate. The first dielectric layer has a contact window, which overlaps with the at least one first conductor. A first terminal of the thin film transistor is electrically connected to the at least one first conductor through the contact window. A physical portion of the first dielectric layer is disposed on between the control terminal of the thin film transistor and the first dummy conductor.

In an embodiment of the disclosure, the pixel array substrate further includes a light-emitting diode element, which is disposed on the second surface of the substrate. A first electrode and a second electrode of the light-emitting diode element are respectively electrically connected to the first pad and the second pad. The light-emitting diode element has a region between the first electrode and the second electrode. The conductors further include a second dummy conductor, which overlaps with the region of the light-emitting diode element and is electrically isolated from the pixel driving circuit and the light-emitting diode element.

In an embodiment of the disclosure, the pixel array substrate further includes a light-emitting diode element and a common line. The light-emitting diode element is disposed on the second surface of the substrate. A first electrode and a second electrode of the light-emitting diode element are respectively electrically connected to the first pad and the second pad. The common line includes a first portion and a second portion. The first portion is disposed on the first surface of the substrate. The pixel driving circuit includes the first portion of the common line. The second portion is disposed on the second surface of the substrate and is electrically connected to the second pad. The second conductor is electrically connected to the first portion and the second portion of the common line. The conductors further include a third dummy conductor, which overlaps with and is electrically isolated from the first portion and the second portion of the common line.

In an embodiment of the disclosure, a film thickness of the second portion of the common line is greater than a film thickness of the first portion of the common line.

In an embodiment of the disclosure, the pixel driving circuit includes a thin film transistor. The pixel array substrate further includes a signal line. The signal line includes a first portion and a second portion. The first portion is disposed on the first surface of the substrate and is electrically connected to a second terminal of the thin film transistor. The pixel driving circuit includes the first portion of the signal line. The second portion is disposed on the second surface of the substrate. The conductors further include a third conductor and a fourth dummy conductor. The third conductor is electrically connected to the first portion and the second portion of the signal line. The fourth dummy conductor overlaps with and is electrically isolated from the first portion and the second portion of the signal line.

In an embodiment of the disclosure, a film thickness of the second portion of the signal line is greater than a film thickness of the first portion of the signal line.

In an embodiment of the disclosure, a line width of the second portion of the signal line is greater than a line width of the first portion of the signal line.

In an embodiment of the disclosure, the pixel driving circuit includes a thin film transistor. The pixel array substrate further includes a first dielectric layer and a first conductive pattern. The first dielectric layer is disposed on the first surface of the substrate and is located between the thin film transistor and the first surface of the substrate. The first conductive pattern is disposed on the first surface of the substrate and is located between the first dielectric layer and the first surface of the substrate. The first terminal of the thin film transistor is electrically connected to the first conductive pattern. The at least one first conductor is multiple first conductors. The first conductive pattern is electrically connected to the first conductors.

In an embodiment of the disclosure, the pixel array substrate further includes a heat-dissipation pattern, which is disposed on the second surface of the substrate and is connected to the first dummy conductor.

In an embodiment of the disclosure, the substrate has an active region and a peripheral region outside the active region. The pixel driving circuit is disposed in the active region of the substrate. The conductors include multiple active region conductors located in the active region and multiple peripheral region conductors located in the peripheral region. The active region conductors include the at least one first conductor, the second conductor, and the first dummy conductor. A reference surface is coplanar with the first surface of the substrate. A vertical projection shape of an active region conductor on the reference surface is different from a vertical projection shape of a peripheral region conductor on the reference surface.

In an embodiment of the disclosure, the substrate has an active region and a peripheral region outside the active region. The pixel driving circuit is disposed in the active region of the substrate. The conductors include multiple active region conductors located in the active region and multiple peripheral region conductors located in the peripheral region. The active region conductors include the at least one first conductor, the second conductor, and the first dummy conductor. A reference surface is coplanar with the first surface of the substrate. The active region conductors are arranged at a first spacing in a direction. The peripheral region conductors are arranged at a second spacing in the direction. The first spacing is different from the second spacing.

In an embodiment of the disclosure, the substrate has an active region and a peripheral region outside the active region. The pixel driving circuit is disposed in the active region of the substrate. The through holes include multiple active region through holes located in the active region and multiple peripheral region through holes located in the peripheral region. The active region through holes are closed openings. The peripheral region through holes are opened openings.

In an embodiment of the disclosure, the substrate has an active region and a peripheral region outside the active region. The pixel driving circuit is disposed in the active region of the substrate. The through holes include multiple active region through holes located in the active region and multiple peripheral region through holes located in the peripheral region. The conductors include multiple active region conductors and multiple peripheral region conductors respectively located in the active region through holes and the peripheral region through holes. The active region conductors include the at least one first conductor, the second conductor, and the first dummy conductor. A peripheral region conductor is retracted in a corresponding peripheral region through hole.

In an embodiment of the disclosure, the substrate has an active region and a peripheral region outside the active region. The through holes include multiple active region through holes located in the active region and multiple peripheral region through holes located in the peripheral region. The conductors include multiple active region conductors and multiple peripheral region conductors respectively located in the active region through holes and the peripheral region through holes. The active region conductors include the at least one first conductor, the second conductor, and the first dummy conductor. The substrate has multiple concave surfaces and multiple outer sidewalls. The concave surfaces respectively define the peripheral region through holes of the substrate. Each outer sidewall is connected between two adjacent concave surfaces. The concave surfaces and the outer sidewalls of the substrate jointly define an edge of the substrate. A peripheral region conductor has a surface. The surface faces away from a corresponding concave surface of the substrate. There is a distance between the surface of the peripheral region conductor and an outer sidewall of the substrate.

In an embodiment of the disclosure, the surface of the peripheral region conductor is substantially a flat surface.

In an embodiment of the disclosure, the surface of the peripheral region conductor is a concave surface.

BRIEF DESCRIPTION OF THE DRAWINGS

FIG. 15 is a schematic top view of a spliced display device 1B according to an embodiment of the disclosure.

FIG. 16 is a schematic top view of a spliced display device 1C according to an embodiment of the disclosure.

FIG. 17 is a schematic top view of a spliced display device 1D according to an embodiment of the disclosure.

DETAILED DESCRIPTION OF DISCLOSED EMBODIMENTS

Figure 1:
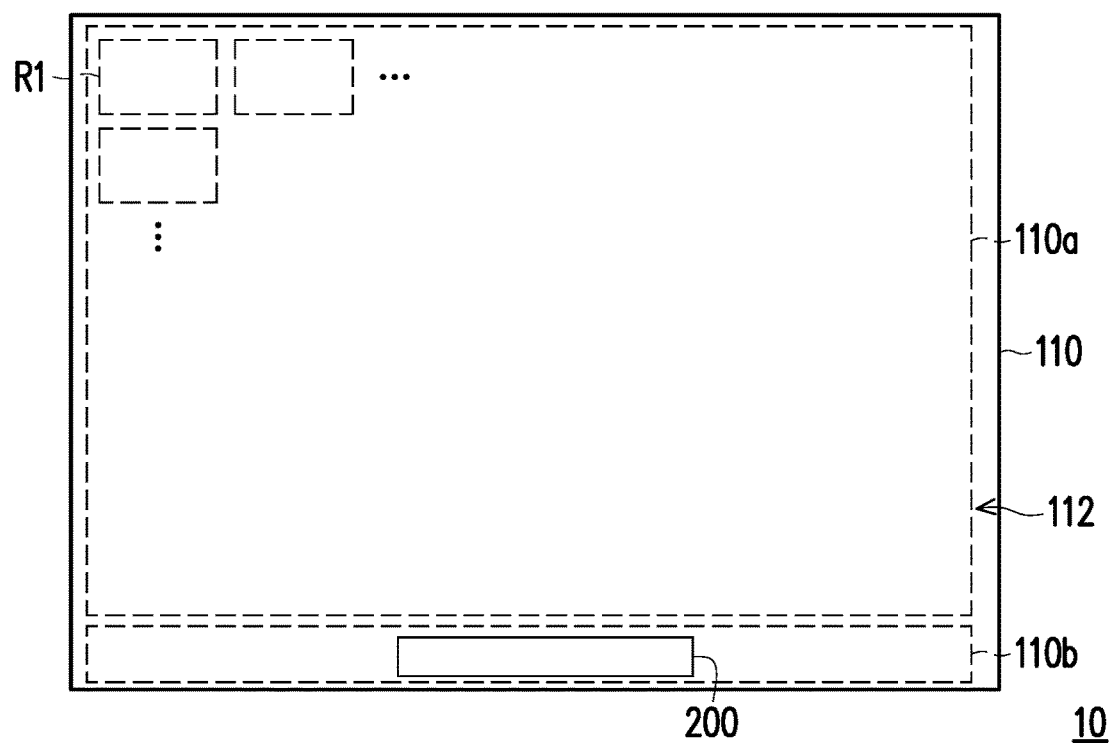
FIG. 1 shows a substrate 110 and a region R1 on a first surface 112 of the substrate 110 of a pixel array substrate 10 according to an embodiment of the disclosure.

Reference will now be made in detail to the exemplary embodiments of the disclosure, and examples of the exemplary embodiments are illustrated in the accompanying drawings. Whenever possible, the same reference numerals are used in the drawings and descriptions to represent the same or similar parts.

It should be understood that when an element such as a layer, a film, a region, or a substrate is referred to as being "on" or "connected to" another element, the element may be directly on or connected to the another element, or there may be an intermediate element. In contrast, when an element is referred to as being "directly on" or "directly connected to" another element, there is no intermediate element. As used herein, "connection" may refer to physical and/or electrical connection. Furthermore, there may be another element between two elements that are "electrically connected" or "coupled".

As used herein, "about", "approximately", or "substantially" includes the stated value and the average value within an acceptable deviation range of a specific value determined by persons skilled in the art, which takes into account the measurement in discussion and the specific amount of measurement-related error (that is, the limitation of the measurement system). For example, "about" may include one or more standard deviations, ±30%, ±20%, ±10%, or ±5% of the stated value. Furthermore, "about", "approximately", or "substantially" used herein may select a more acceptable deviation range or standard deviation according to optical properties, etching properties, or other properties instead of applying one standard deviation to all properties.

Unless otherwise defined, all terms (including technical and scientific terms) used herein have the same meanings as commonly understood by persons skilled in the art to which the disclosure belongs. It will be further understood that terms such as those defined in commonly used dictionaries should be interpreted as having meanings consistent with the meanings of the terms in the related technologies and the context of the disclosure, and will not be interpreted as idealized or overly formal meanings unless explicitly defined herein.

FIG. 1 shows a substrate 110 and a region R1 on a first surface 112 of the substrate 110 of a pixel array substrate 10 according to an embodiment of the disclosure.

Figure 2:
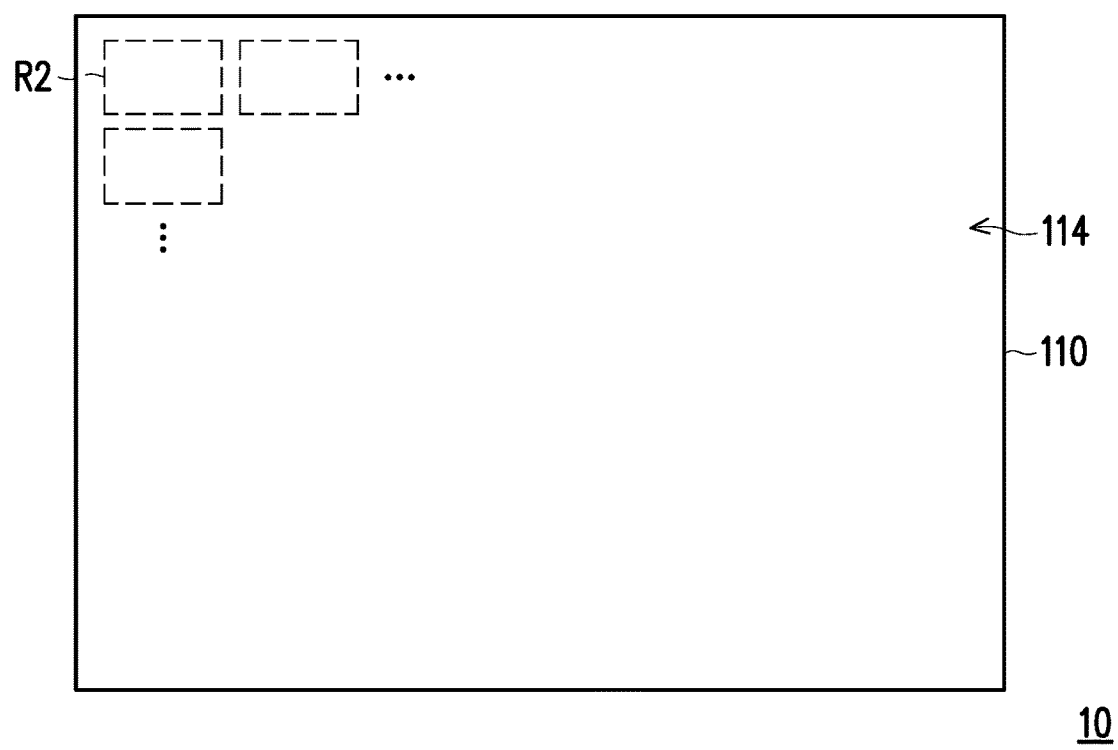
FIG. 2 shows the substrate 110 and a region R2 on a second surface 114 of the substrate 110 of the pixel array substrate 10 according to an embodiment of the disclosure.

FIG. 2 shows the substrate 110 and a region R2 on a second surface 114 of the substrate 110 of the pixel array substrate 10 according to an embodiment of the disclosure. The second surface 114 is a back surface of a paper surface of FIG. 2.

Figure 3:
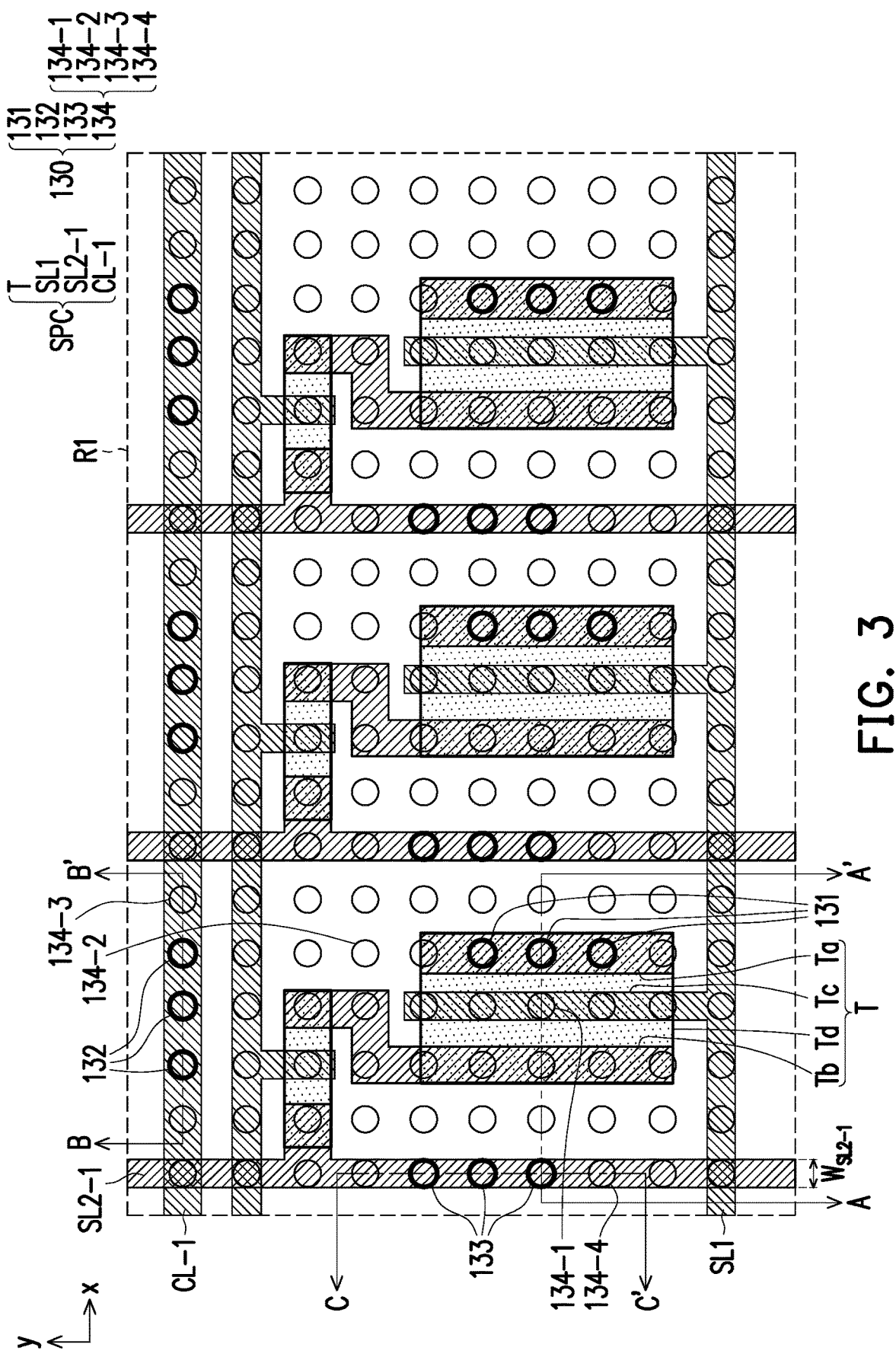
FIG. 3 is an enlarged schematic view of the region R1 of FIG. 1.

FIG. 3 is an enlarged schematic view of the region R1 of FIG. 1. The region R1 may be regarded as a pixel region of the pixel array substrate 10.

Figure 4:
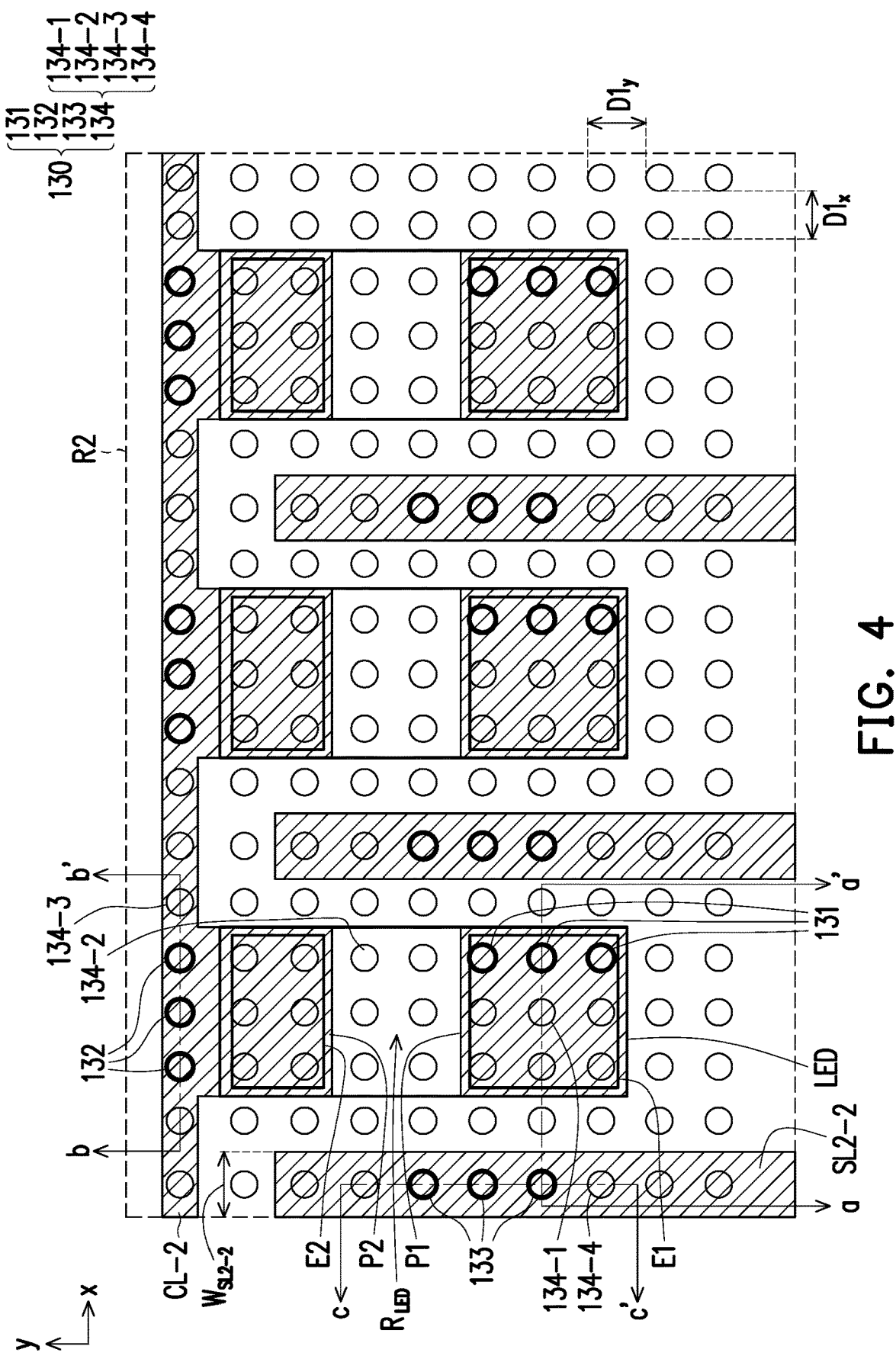
FIG. 4 is an enlarged schematic view of the region R2 of FIG. 2.

FIG. 4 is an enlarged schematic view of the region R2 of FIG. 2. The region R2 coincides with the region R1.

Figure 5:
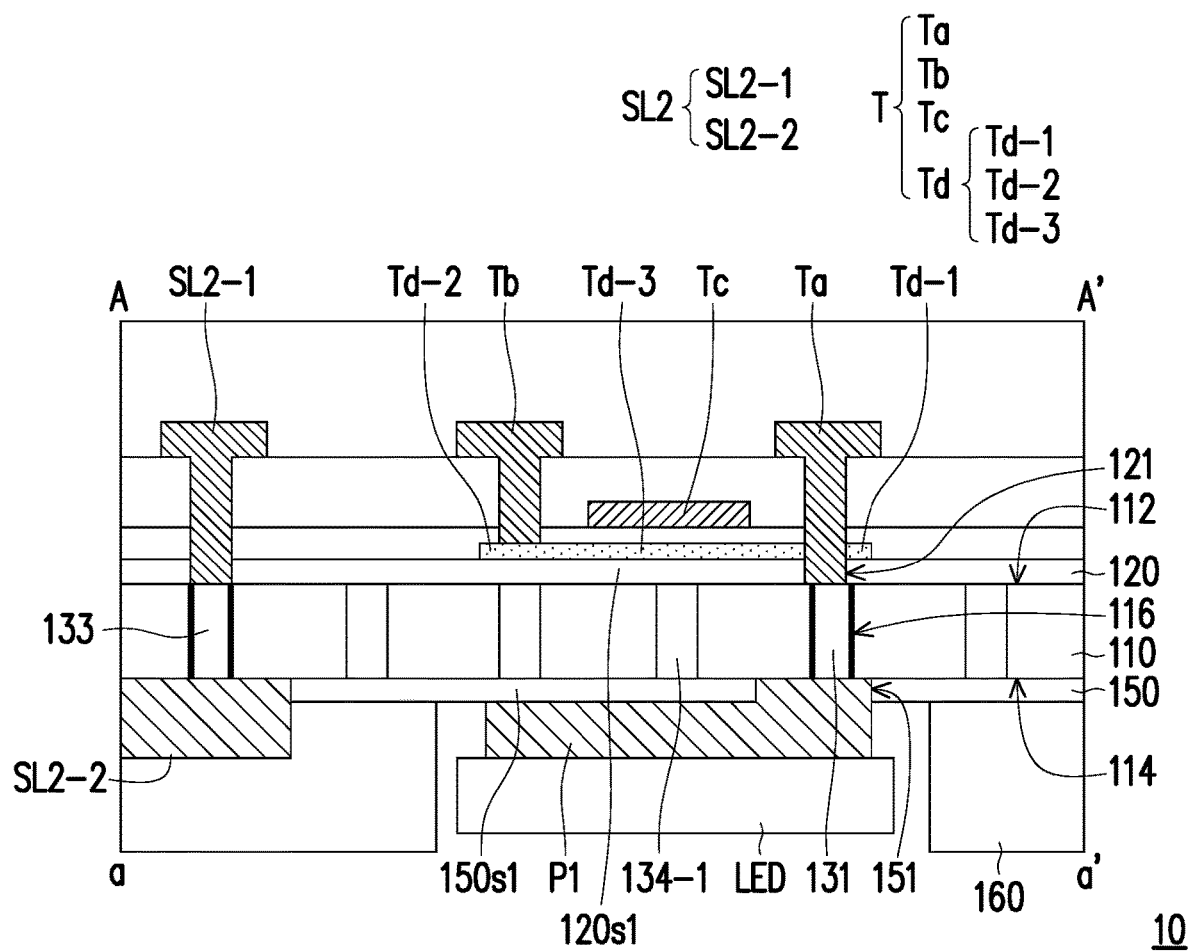
FIG. 5 is a schematic cross-sectional view of the pixel array substrate 10 according to an embodiment of the disclosure.

FIG. 5 is a schematic cross-sectional view of the pixel array substrate 10 according to an embodiment of the disclosure. FIG. 5 corresponds to a section line A-A' of FIG. 3 and a section line a-a' of FIG. 4.

Figure 6:
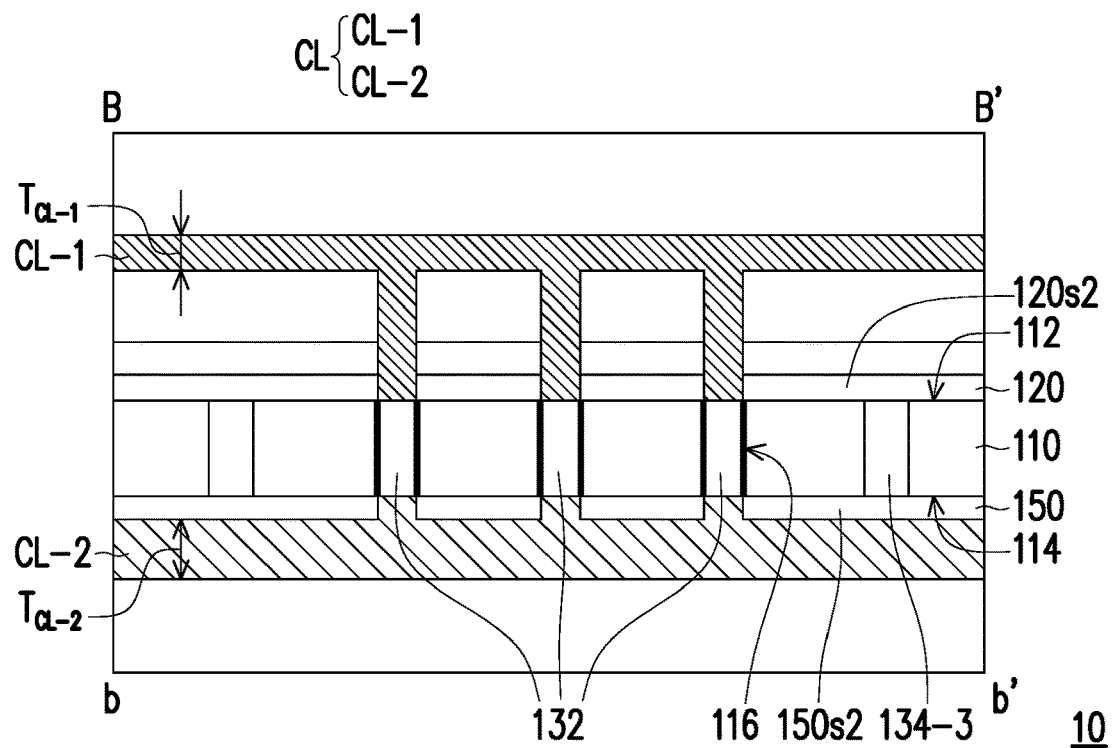
FIG. 6 is a schematic cross-sectional view of the pixel array substrate 10 according to an embodiment of the disclosure.

FIG. 6 is a schematic cross-sectional view of the pixel array substrate 10 according to an embodiment of the disclosure. FIG. 6 corresponds to a section line B-B' of FIG. 3 and a section line b-b' of FIG. 4.

Figure 7:
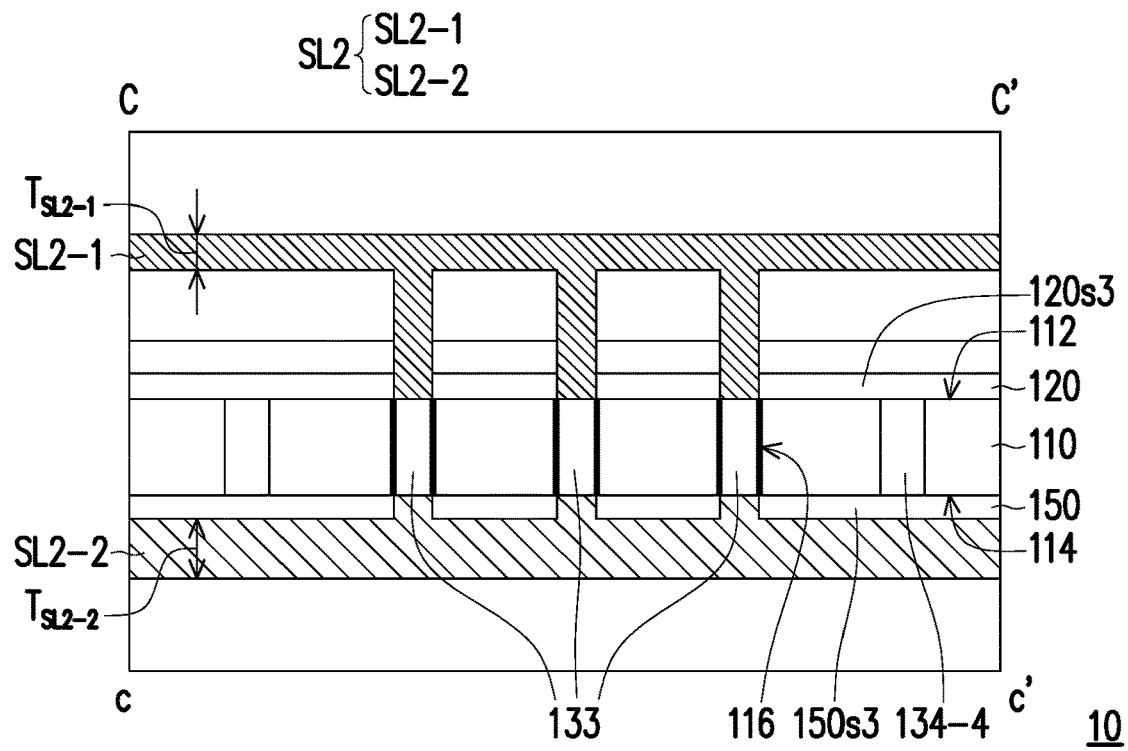
FIG. 7 is a schematic cross-sectional view of the pixel array substrate 10 according to an embodiment of the disclosure.

FIG. 7 is a schematic cross-sectional view of the pixel array substrate 10 according to an embodiment of the disclosure. FIG. 7 corresponds to a section line C-C' of FIG. 3 and a section line c-c' of FIG. 4.

Please refer to FIG. 1 to FIG. 5. The pixel array substrate 10 includes the substrate 110. The substrate 110 has the first surface 112, the second surface 114, and multiple through holes 116. The first surface 112 is opposite to the second surface 114, and the through holes 116 extend from the first surface 112 to the second surface 114. The pixel array substrate 10 further includes multiple conductors 130, which are respectively disposed in the through holes 116.

Please refer to FIG. 3 and FIG. 4. In this embodiment, the conductors 130 respectively disposed in the through holes 116 may be arranged in an array. For example, in this embodiment, the conductors 130 may be arranged at equal spacings in a direction x, and the conductors 130 may also be arranged at equal spacings in a direction y. The direction x and the direction y intersect (for example, but not limited to: perpendicular to each other). In this embodiment, the spacing between two adjacent conductors 130 in the direction x is $D1_x$, the spacing between two adjacent conductors 130 in the direction y is $D1_y$, and $D1_x$ and $D1_y$ may be the same or different. In this embodiment, 1 µm≤$D1_x$≤400 µm and 1 µm≤$D1_y$≤400 µm, but the disclosure is not limited thereto.

In this embodiment, the material of the substrate 110 may be glass, quartz, an organic polymer, or an opaque/reflective material (for example, but not limited to: a wafer, ceramics, or other applicable materials), or other applicable materials.

In this embodiment, based on the consideration of conductivity, the conductor 130 generally uses a metal or a stacked layer of multiple metals. However, the disclosure is not limited thereto. According to other embodiments, the conductor 130 may also use other conductive materials, such as alloys, nitrides of metallic materials, oxides of metallic materials, oxynitrides of metallic materials, or stacked layers of metal materials and other conductive materials.

Please refer to FIG. 3 and FIG. 5. The pixel array substrate 10 further includes a pixel driving circuit SPC, which is disposed on the first surface 112 of the substrate 110. In this embodiment, the pixel driving circuit SPC includes a thin film transistor T. The thin film transistor T has a first terminal Ta, a second terminal Tb, a control terminal Tc, and a semiconductor pattern Td. The semiconductor pattern Td has a first region Td-1, a second region Td-2, and a channel Td-3. The first region Td-1 and the second region Td-2 of the semiconductor pattern Td respectively overlap with the first terminal Ta and the second terminal Tb of the thin film transistor T, and the channel Td-3 is disposed between the first region Td-1 and the second region Td-2 of the semiconductor pattern Td.

For example, in this embodiment, the control terminal Tc of the thin film transistor T may be selectively disposed on the semiconductor pattern Td, and the thin film transistor T is a top gate type transistor. However, the disclosure is not limited thereto. In other embodiments, the thin film transistor T may also be a bottom gate type or other types of transistors.

In this embodiment, the pixel driving circuit SPC may further include a signal line SL1 and a first portion SL2-1 of a signal line SL2. The signal line SL1 is electrically connected to the control terminal Tc of the thin film transistor T, the first portion SL2-1 of the signal line SL2 and the signal line SL1 intersect, and the first portion SL2-1 of the signal line SL2 is electrically connected to the second terminal Tb of the thin film transistor T. In addition, in this embodiment, the pixel driving circuit SPC may further include a first portion CL-1 of a common line CL disposed on the first surface 112.

Please refer to FIG. 1 and FIG. 3. The substrate 110 has an active region 110a and a peripheral region 110b outside the active region 110a. The pixel driving circuit SPC is disposed in the active region 110a of the substrate 110. In this embodiment, a drive element 200 may be selectively disposed on the first surface 112 of the substrate 110, and the drive element 200 may be electrically connected to the signal line SL1, the first portion SL2-1 of the signal line SL2, the first portion CL-1 of the common line CL, or a combination of at least two of the above. In this embodiment, the drive element 200 may include an integrated circuit (IC), an integrated gate driver-on-array (GOA), or a combination thereof.

Please refer to FIG. 4 and FIG. 5. The pixel array substrate 10 further includes a first pad P1 and a second pad P2, which are disposed on the second surface 114 of the substrate 110. The first pad P1 and the second pad P2 are respectively configured to be electrically connected to a first electrode E1 and a second electrode E2 of a light-emitting diode element LED.

Please refer to FIG. 3, FIG. 4, and FIG. 5. The conductors 130 disposed in the through holes 116 of the substrate 110 include a first conductor 131. The first conductor 131 is electrically connected to the pixel driving circuit SPC located on the first surface 112 and the first pad P1 located on the second surface 114. Specifically, in this embodiment, the first conductor 131 is electrically connected to the first terminal Ta of the thin film transistor T located on the first surface 112 and the first pad P1 located on the second surface 114.

Please refer to FIG. 3, FIG. 4, and FIG. 6. The conductors 130 disposed in the through holes 116 of the substrate 110 further include a second conductor 132. The second conductor 132 is electrically connected to the pixel driving circuit SPC and the second pad P2. Specifically, in this embodiment, the common line CL includes not only the first portion CL-1 disposed on the first surface 112, but also a second portion CL-2 disposed on the second surface 114. The first portion CL-1 of the common line CL overlaps with the second portion CL-2 of the common line CL. The second portion CL-2 of the common line CL is electrically connected to the second pad P2 (as shown in FIG. 4). The second conductor 132 is electrically connected to the first portion CL-1 of the common line CL and the second portion CL-2 of the common line CL. In this way, the first portion CL-1 of the common line CL of the pixel driving circuit SPC located on the first surface 112 may be electrically connected to the second pad P2 located on the second surface 114.

Please refer to FIG. 3, FIG. 4, and FIG. 5. It is worth noting that the conductors 130 disposed in the through holes 116 of the substrate 110 further include multiple dummy conductors 134, which are electrically isolated from the conductive component (for example, but not limited to: the pixel driving circuit SPC) located on the first surface 112 and the conductive component (for example, but not limited to: the first pad P1) located on the second surface 114.

The dummy conductors 134 include a first dummy conductor 134-1, which overlaps with and is electrically isolated from the pixel driving circuit SPC. For example, in this embodiment, the first dummy conductor 134-1 may overlap with the channel Td-3 of the thin film transistor T. In this embodiment, the first dummy conductor 134-1 may also overlap with the control terminal Tc of the thin film transistor T, but the disclosure is not limited thereto.

In this embodiment, the pixel array substrate 10 further includes a first dielectric layer 120 (shown in FIG. 5), which is disposed between the thin film transistor T and the first surface 112 of the substrate 110. The first dielectric layer 120 has a contact window 121 overlapping with the first conductor 131. The first terminal Ta of the thin film transistor T is electrically connected to the first conductor 131 in the through hole 116 of the substrate 110 through the contact window 121. In this embodiment, the first dielectric layer 120 has a physical portion 120s1. The physical portion 120s1 is disposed between the channel Td-3 of the thin film transistor T and the first dummy conductor 134-1, and the physical portion 120s1 is disposed between the control terminal Tc of the thin film transistor T and the first dummy conductor 134-1, so that the first dummy conductor 134-1 is electrically isolated from the pixel driving circuit SPC disposed on the first surface 112.

In this embodiment, the pixel array substrate 10 further includes a second dielectric layer 150 (shown in FIG. 5), which is disposed on the second surface 114 of the substrate 110. The second dielectric layer 150 has a contact window 151 overlapping with the first conductor 131. The first pad P1 is electrically connected to the first conductor 131 in the through hole 116 of the substrate 110 through the contact window 151. In this embodiment, the second dielectric layer 150 has a physical portion 150s1, and the physical portion 150s1 is disposed between the first pad P1 and the first dummy conductor 134-1, so that the first dummy conductor 134-1 is electrically isolated from the first pad P1 disposed on the second surface 114.

Please refer to FIG. 3, FIG. 4, and FIG. 5. In this embodiment, the pixel array substrate 10 further includes the light-emitting diode element LED, which is disposed on the second surface 114 of the substrate 110. The first electrode E1 and the second electrode E2 of the light-emitting diode element LED are respectively electrically connected to the first pad P1 and the second pad P2. The light-emitting diode element LED has a region $R_{LED}$ located between the first electrode E1 and the second electrode E2. The dummy conductors 134 further include a second dummy conductor 134-2, which overlaps with the region $R_{LED}$ of the light-emitting diode element LED and is electrically isolated from the pixel driving circuit SPC and the light-emitting diode element LED. Specifically, in this embodiment, a physical portion (not shown) of the first dielectric layer 120 (shown in FIG. 5) is disposed on one end of the second dummy conductor 134-2 close to the first surface 112, so that the second dummy conductor 134-2 is electrically isolated from the pixel driving circuit SPC. A physical portion (not shown) of the second dielectric layer 150 (shown in FIG. 5) is disposed on one end of the second dummy conductor 134-2 close to the second surface 114, so that the second dummy conductor 134-2 is electrically isolated from the light-emitting diode element LED.

Please refer to FIG. 3, FIG. 4, and FIG. 6. In this embodiment, the dummy conductors 134 further include a third dummy conductor 134-3, which overlaps with and is electrically isolated from the first portion CL-1 and the second portion CL-2 of the common line CL. Specifically, in this embodiment, a physical portion 120s2 of the first dielectric layer 120 is disposed on one end of the third dummy conductor 134-3 close to the first surface 112, so that the third dummy conductor 134-3 is electrically isolated from the first portion CL-1 of the common line CL. A physical portion 150s2 of the second dielectric layer 150 is disposed on one end of the third dummy conductor 134-3 close to the second surface 114, so that the third dummy conductor 134-3 is electrically isolated from the second portion CL-2 of the common line CL.

In addition, in this embodiment, a film thickness $T_{CL-2}$ of the second portion CL-2 of the common line CL may be selectively greater than a film thickness $T_{CL-1}$ of the first portion CL-1 of the common line CL. In this way, the resistance of the common line CL may be reduced to improve the performance of the pixel array substrate 10.

Please refer to FIG. 3, FIG. 4, and FIG. 7. In this embodiment, the signal line SL2 includes not only the first portion SL2-1 disposed on the first surface 112a, but also a second portion SL2-2 disposed on the second surface 114. The first portion SL2-1 of the signal line SL2 overlaps with the second portion SL2-2 of the signal line SL2. In this embodiment, the conductors 130 disposed in the through holes 116 of the substrate 110 further include a third conductor 133, which is electrically connected to the first portion SL2-1 and the second portion SL2-2 of the signal line SL2. The dummy conductors 134 further include a fourth dummy conductor 134-4, which overlaps with and is electrically isolated from the first portion SL2-1 and the second portion SL2-2 of the signal line SL2. Specifically, in this embodiment, a physical portion 120s3 of the first dielectric layer 120 is disposed on one end of the fourth dummy conductor 134-4 close to the first surface 112, so that the fourth dummy conductor 134-4 is electrically isolated from the first portion SL2-1 of the signal line SL2. A physical portion 150s3 of the second dielectric layer 150 is disposed on one end of the fourth dummy conductor 134-4 close to the second surface 114, so that the fourth dummy conductor 134-4 is electrically isolated from the second portion SL2-2 of the signal line SL2.

In addition, in this embodiment, a film thickness $T_{SL2-2}$ of the second portion SL2-2 of the signal line SL2 may be selectively greater than a film thickness $T_{SL2-1}$ of the first portion SL2-1 of the signal line SL2. A line width $W_{SL2-2}$ of the second portion SL2-2 of the signal line SL2 may be selectively greater than a line width $W_{SL2-1}$ of the first portion SL2-1 of the signal line SL2. In this way, the resistance of the signal line SL2 may be reduced to improve the performance of the pixel array substrate 10.

It must be noted here that the following embodiments continue to use the reference numerals of elements and some content of the foregoing embodiments. The same reference numerals are adopted to represent the same or similar elements, and the description of the same technical content is omitted. For the description of the omissions, please refer to the foregoing embodiments, which will not be repeated in the following embodiments.

Figure 8:
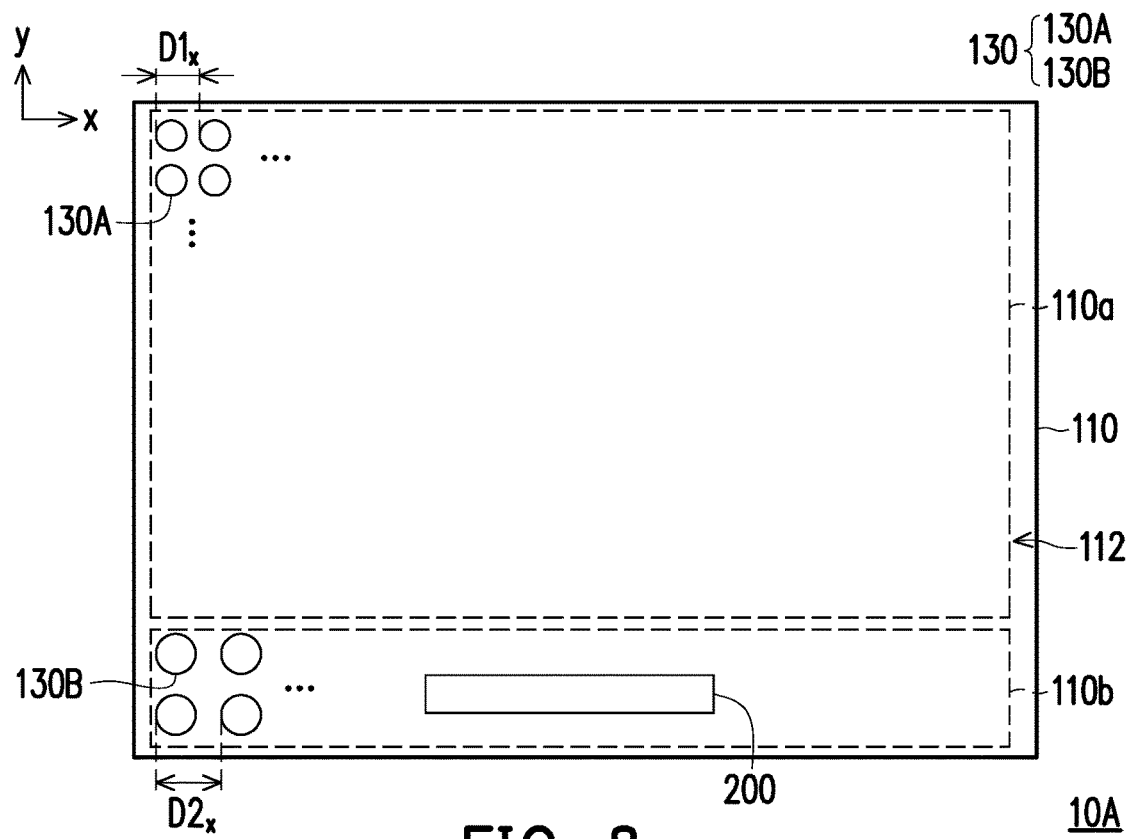
FIG. 8 shows a conductor 130, a substrate 110, and components on a first surface 112 of a substrate 110 of a pixel array substrate 10A according to an embodiment of the disclosure.

FIG. 8 shows a conductor 130, a substrate 110, and components on a first surface 112 of a substrate 110 of a pixel array substrate 10A according to an embodiment of the disclosure.

The pixel array substrate 10A of FIG. 8 is similar to the pixel array substrate 10 of FIG. 1, and the difference between the two is that the conductors 130 of the two are not completely the same.

Please refer to FIG. 8. Specifically, in this embodiment, multiple conductors 130 include multiple active region conductors 130A located in an active region 110a and multiple peripheral region conductors 130B located in a peripheral region 110b. The active region conductors 130A include a first conductor 131 (refer to FIG. 3 and FIG. 4), a second conductor 132 (refer to FIG. 3 and FIG. 4), and a first dummy conductor 134-1 (refer to FIG. 3 and FIG. 4). A reference surface (such as a paper surface of FIG. 8) is coplanar with the first surface 112 of the substrate 110. The active region conductors 130A are arranged at spacings $D1_x$ in a direction x, the peripheral region conductors 130B are arranged at spacings $D2_x$ in the direction x, and the spacing $D1_x$ is different from the spacing $D2_x$.

In this embodiment, the peripheral region 110b disposed with the peripheral region conductors 130B may include a bonding region. The peripheral region conductors 130B with different spacings $D2_x$ facilitate the bonding between a drive element 200 and the pixel array substrate 10A.

Figure 9:
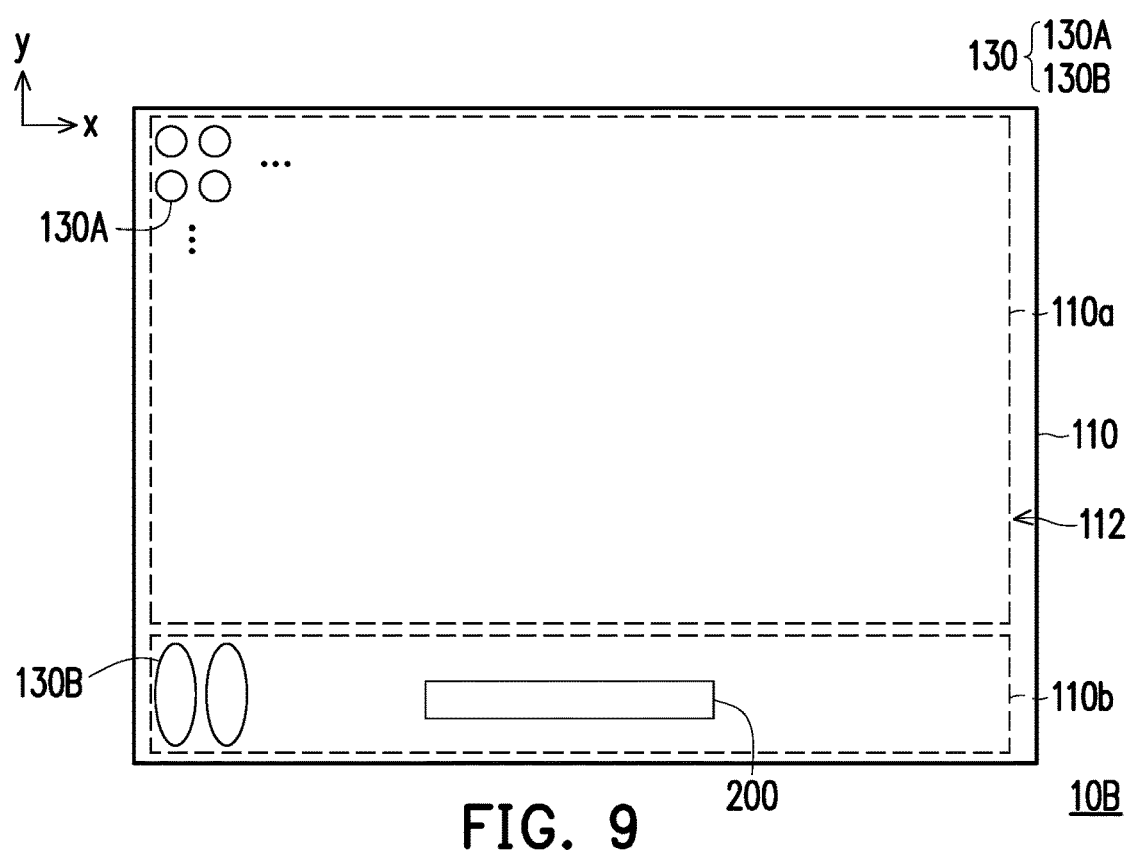
FIG. 9 shows a conductor 130, a substrate 110, and components on a first surface 112 of a substrate 110 of a pixel array substrate 10B according to an embodiment of the disclosure.

FIG. 9 shows a conductor 130, a substrate 110, and components on a first surface 112 of a substrate 110 of a pixel array substrate 10B according to an embodiment of the disclosure.

The pixel array substrate 10B of FIG. 9 is similar to the pixel array substrate 10 of FIG. 1, and the difference between the two is that the conductors 130 of the two are not completely the same.

Please refer to FIG. 9. Specifically, in this embodiment, multiple conductors 130 include multiple active region conductors 130A located in an active region 110a and multiple peripheral region conductors 130B located in a peripheral region 110b. The active region conductors 130A include a first conductor 131 (refer to FIG. 3 and FIG. 4). A reference surface (such as a paper surface of FIG. 9) is coplanar with the first surface 112 of the substrate 110. A vertical projection shape of the active region conductor 130A on the reference surfaces is different from a vertical projection shape of the peripheral region conductor 130B on the reference surface. For example, in this embodiment, the vertical projection shape of the active region conductor 130A on the reference surface may selectively be a circle, and the vertical projection shape of the peripheral region conductor 130B on the reference surface may selectively be an ellipse, but the disclosure is not limited thereto.

In this embodiment, the peripheral region 110b disposed with the peripheral region conductors 130B may include a bonding region. The peripheral region conductors 130B with different vertical projection shapes facilitate the bonding between a drive element 200 and the pixel array substrate 10B.

Figure 10:
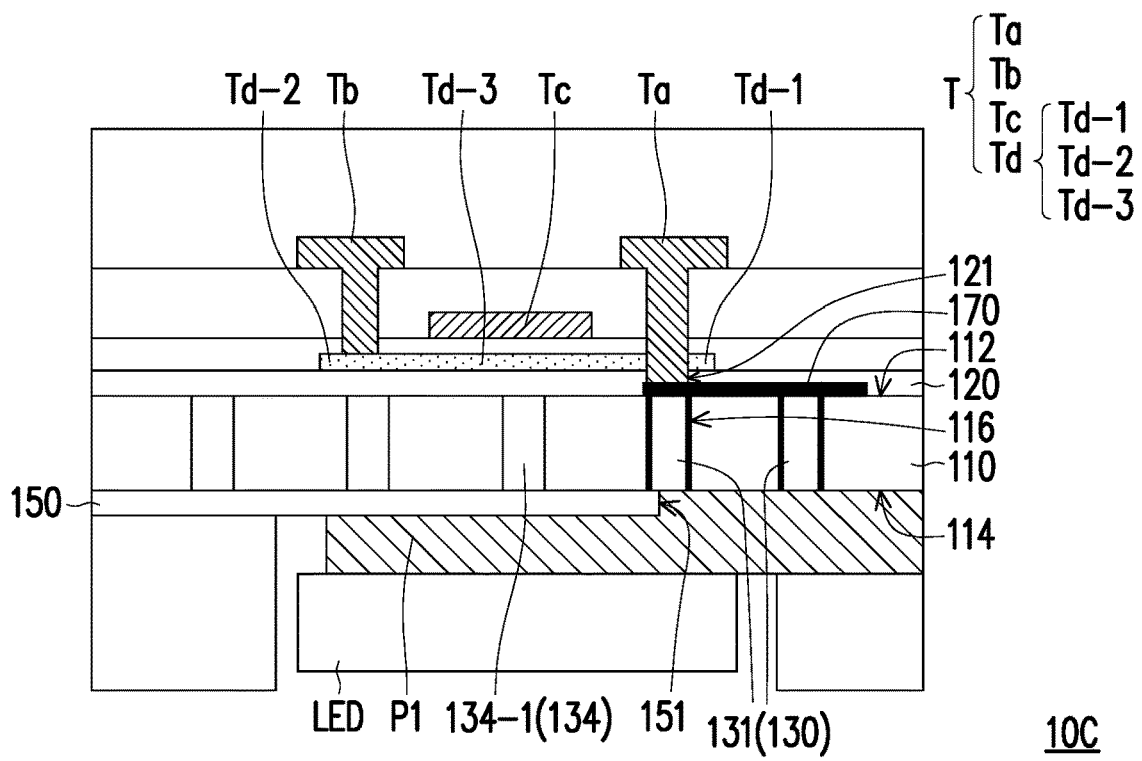
FIG. 10 is a schematic cross-sectional view of a pixel array substrate 10C according to an embodiment of the disclosure.

FIG. 10 is a schematic cross-sectional view of a pixel array substrate 10C according to an embodiment of the disclosure.

The pixel array substrate 10C of FIG. 10 is similar to the pixel array substrate 10 of FIG. 5, and the difference between the two is that the pixel array substrate 10C of FIG. 10 further includes a first conductive pattern 170. Please refer to FIG. 10. The first conductive pattern 170 is disposed on a first surface 112 of a substrate 110 and is located between a first dielectric layer 120 and the first surface 112 of the substrate 110. A first terminal Ta of a thin film transistor T is electrically connected to the first conductive pattern 170, and the first conductive pattern 170 is electrically connected to multiple first conductors 131. The first conductive pattern 170 is used to connect the first conductors 131, so that the resistance of the connection line between the first terminal Ta of the thin film transistor T and a first pad P1 may be reduced without being restricted by the design rule.

Figure 11:
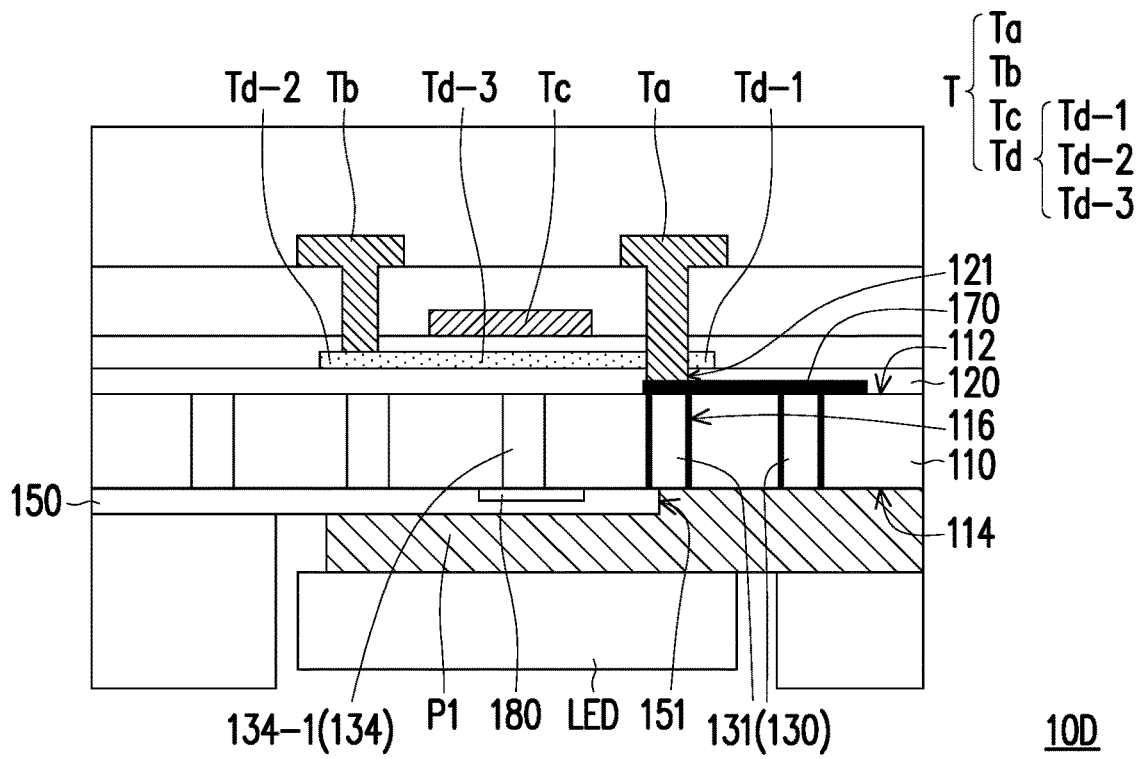
FIG. 11 is a schematic cross-sectional view of a pixel array substrate 10D according to an embodiment of the disclosure.

FIG. 11 is a schematic cross-sectional view of a pixel array substrate 10D according to an embodiment of the disclosure.

The pixel array substrate 10D of FIG. 11 is similar to the pixel array substrate 10C of FIG. 10, and the difference between the two is that the pixel array substrate 10D of FIG. 11 further includes a heat-dissipation pattern 180, which is disposed on a second surface 114 of a substrate 110 and is connected to a first dummy conductor 134-1. The heat-dissipation pattern 180 facilitates the heat dissipation of a thin film transistor T and/or a light-emitting diode element LED.

Figure 12:
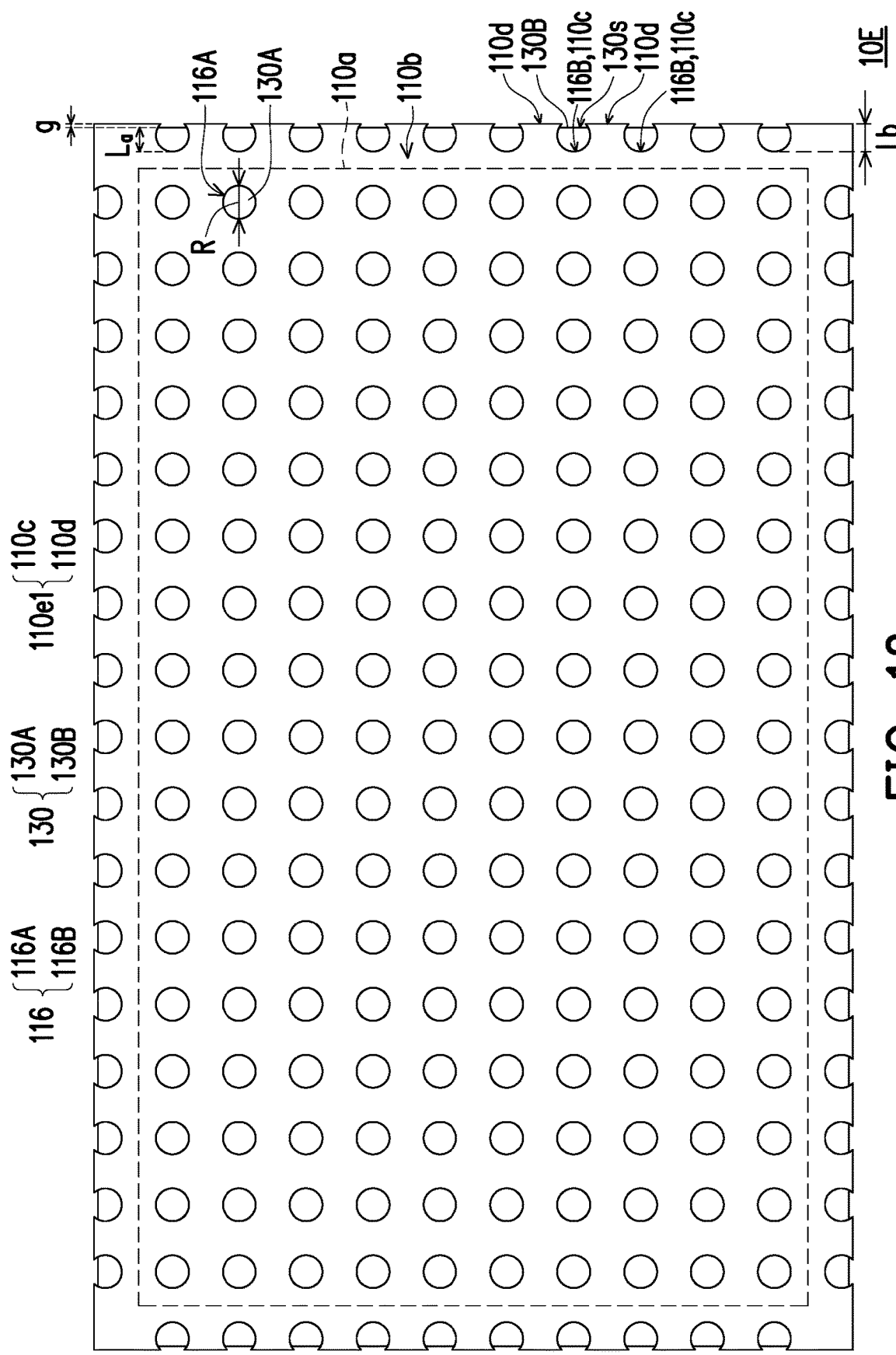
FIG. 12 is a schematic cross-sectional view of a pixel array substrate 10E according to an embodiment of the disclosure.

FIG. 12 is a schematic cross-sectional view of a pixel array substrate 10E according to an embodiment of the disclosure.

The pixel array substrate 10E of FIG. 12 is similar to the pixel array substrate 10, and the difference between the two is that the form of through holes 116 located in a peripheral region 110b is different.

Please refer to FIG. 12. Specifically, in this embodiment, the through holes 116 of a substrate 110 include multiple active region through holes 116A located in an active region 110a and multiple peripheral region through holes 116B located in the peripheral region 110b. The active region through holes 116A are closed opening. In particular, the peripheral region through holes 116B are opened openings.

In addition, in this embodiment, multiple conductors 130 include multiple active region conductors 130A and multiple peripheral region conductors 130B respectively located in the active region through holes 116A and the peripheral region through holes 116B. In particular, the peripheral region conductor 130B is retracted into the corresponding peripheral region through hole 116B.

The substrate 110 has multiple concave surfaces 110c and multiple outer sidewalls 110d defining the peripheral region through holes 116B. The concave surfaces 110c and the outer sidewalls 110d of the substrate 110 jointly define an edge 110e-1 of the substrate 110. Each outer sidewall 110d is connected between two adjacent concave surfaces 110c. The peripheral region conductor 130B has a surface 130s. The surface 130s faces away from the corresponding concave surface 110c of the substrate 110. There is a distance g between the surface 130s of the peripheral region conductor 130B and the outer sidewall 110d of the substrate 110.

As such, when the pixel array substrate 10E is spliced with other pixel array substrates (not shown), short circuit with other pixel array substrates is less likely to occur.

For example, in this embodiment, the active region through hole 116A has a diameter R, there is a distance La, where La>(R/2), between the surface 130s of the peripheral region conductor 130B and a bottom portion of the concave surface 110c, and there is a distance Lb, where Lb>(2R/3), between the outer sidewall 110d of the substrate 110 and the bottom portion of the concave surface 110c, but the disclosure is not limited thereto.

Figure 13:
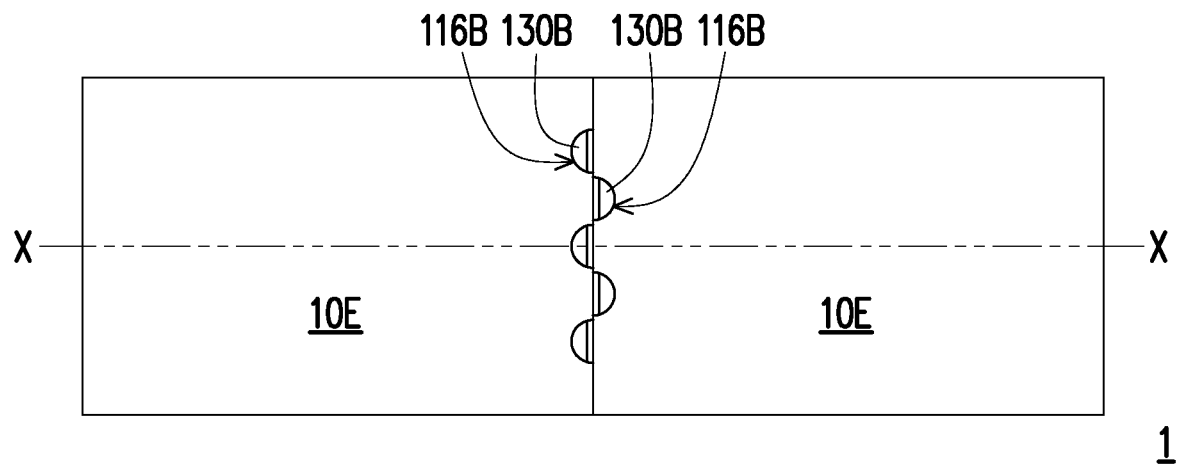
FIG. 13 is a schematic top view of a spliced display device 1 according to an embodiment of the disclosure.

FIG. 13 is a schematic top view of a spliced display device 1 according to an embodiment of the disclosure.

Please refer to FIG. 13. The spliced display device 1 is formed by splicing multiple pixel array substrates 10E with the retracted peripheral region conductors 130B. In this embodiment, a central axis X of the adjacent pixel array substrates 10E may substantially be on the same straight line, and the peripheral region through holes 116B of the adjacent pixel array substrates 10E and the peripheral region conductors 130B retracted into the peripheral region through holes 116B may be selectively staggered with each other. In this way, the adjacent pixel array substrates 10E are less likely to short circuit.

Figure 14:
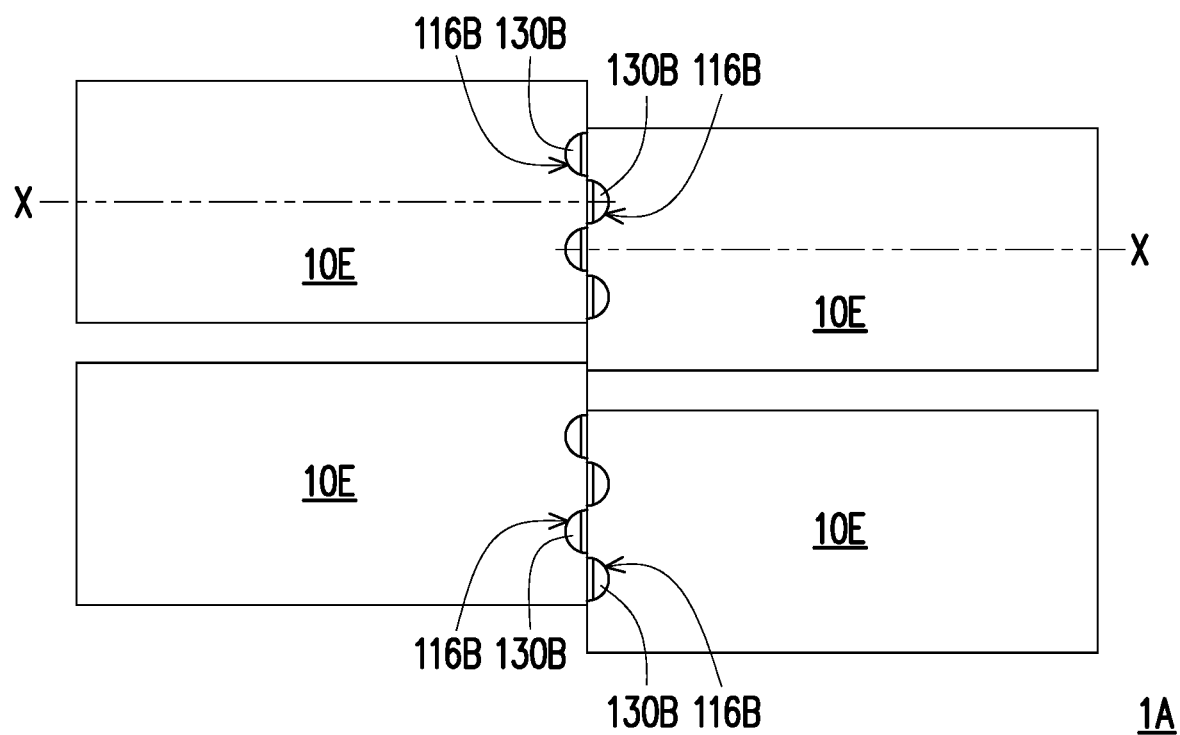
FIG. 14 is a schematic top view of a spliced display device 1A according to an embodiment of the disclosure.

FIG. 14 is a schematic top view of a spliced display device 1A according to an embodiment of the disclosure.

Please refer to FIG. 14. The spliced display device 1A is formed by splicing multiple pixel array substrates 10E with the retracted peripheral region conductors 130B. In this embodiment, a central axis X of the adjacent pixel array substrates 10E may not be on the same straight line, so that the peripheral region through holes 116B of the adjacent pixel array substrate 10E and the peripheral region conductors 130B retracted into the peripheral region through holes 116B are staggered with each other. In this way, the adjacent pixel array substrates 10E are less likely to short circuit.

FIG. 15 is a schematic top view of a spliced display device 1B according to an embodiment of the disclosure.

Please refer to FIG. 15. The spliced display device 1B is formed by splicing multiple pixel array substrates 10E' with the retracted peripheral region conductors 130B. The pixel array substrate 10E' of FIG. 15 is similar to the pixel array substrate 10E of FIG. 11, and the difference between the two is that in the embodiment of FIG. 11, the surface 130s of the peripheral region conductor 130B is substantially a flat surface; however, in the embodiment of FIG. 15, the peripheral region conductors 130B may be conformally disposed on a concave surface 110c of a substrate 110, and a surface 130s of the peripheral region conductor 130B may be a concave surface.

In addition, in this embodiment, the concave surface 110c defining the peripheral region through holes 116B of the substrate 110 has a contact area that is in contact with the peripheral region conductors 130B. The contact area may be cut out by a flat surface (that is, a paper surface of FIG. 15) parallel to a first surface 112 to form a section line L4. The section line L4 has a length d4, and the peripheral region through holes 116B have a maximum width d1 in a direction k parallel to the first surface 112, where d4>d1. In this way, the peripheral region conductors 130B may be prevented from peeling off from the peripheral region through holes 116B, but the disclosure is not limited thereto.

FIG. 16 is a schematic top view of a spliced display device 1C according to an embodiment of the disclosure.

The spliced display device 1C of FIG. 16 is similar to the spliced display device 1B of FIG. 15, and the difference between the two is that in the embodiment of FIG. 15, the peripheral region through holes 116B are cut out by the flat surface (that is, the paper surface of FIG. 15) parallel to the first surface 112 to form a section line M, which may be a portion of a circle; and in the embodiment of FIG. 16, the peripheral region through holes 116B are cut out by a flat surface (that is, a paper surface of FIG. 16) parallel to a first surface 112 to form a section line M, which may be a portion of an ellipse.

FIG. 17 is a schematic top view of a spliced display device 1D according to an embodiment of the disclosure.

The spliced display device 1D of FIG. 17 is similar to the spliced display device 1B of FIG. 15, and the difference between the two is that in the embodiment of FIG. 15, the peripheral region through holes 116B are cut out by the flat surface (that is, the paper surface of FIG. 15) parallel to the first surface 112 to form the section line M, which may be a portion of a circle, and the length of the section line M is close to half of the circumference of the circle; and in the embodiment of FIG. 17, the peripheral region through holes 116B is cut out by a flat surface (that is, a paper surface of FIG. 17) parallel to the first surface 112 to form a section line M, which may be a portion of a circle, and the length of the section line M is obviously greater than half of the circumference of the circle.

Figure 18:
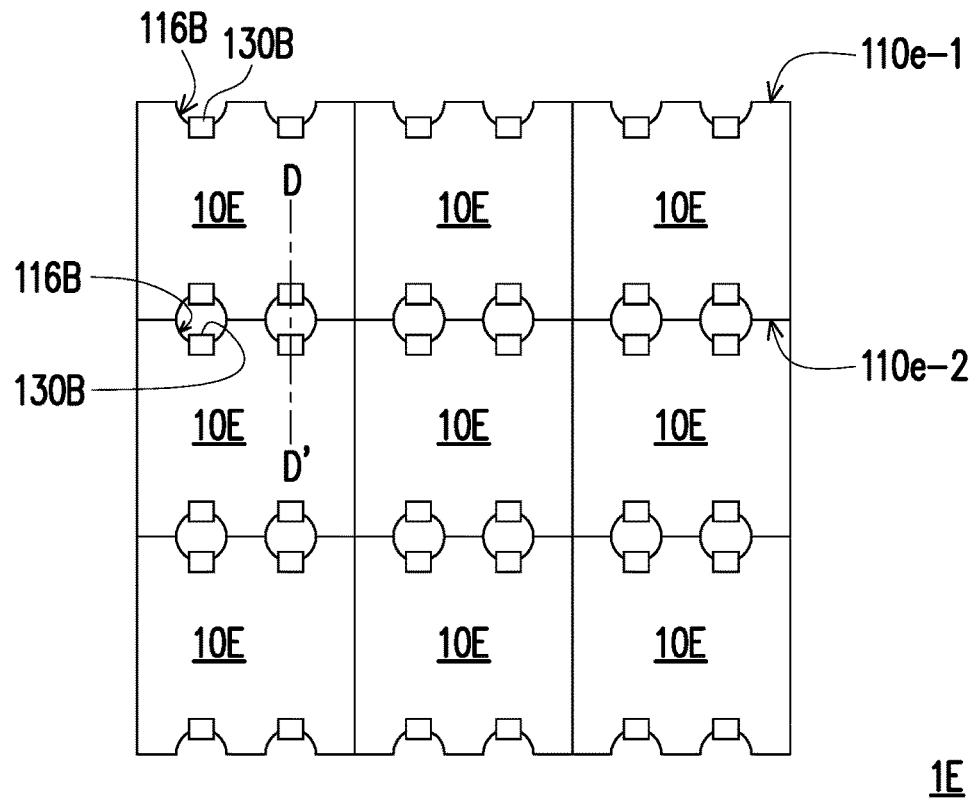
FIG. 18 is a schematic top view of a spliced display device 1E according to an embodiment of the disclosure.

FIG. 18 is a schematic top view of a spliced display device 1E according to an embodiment of the disclosure.

Figure 19:
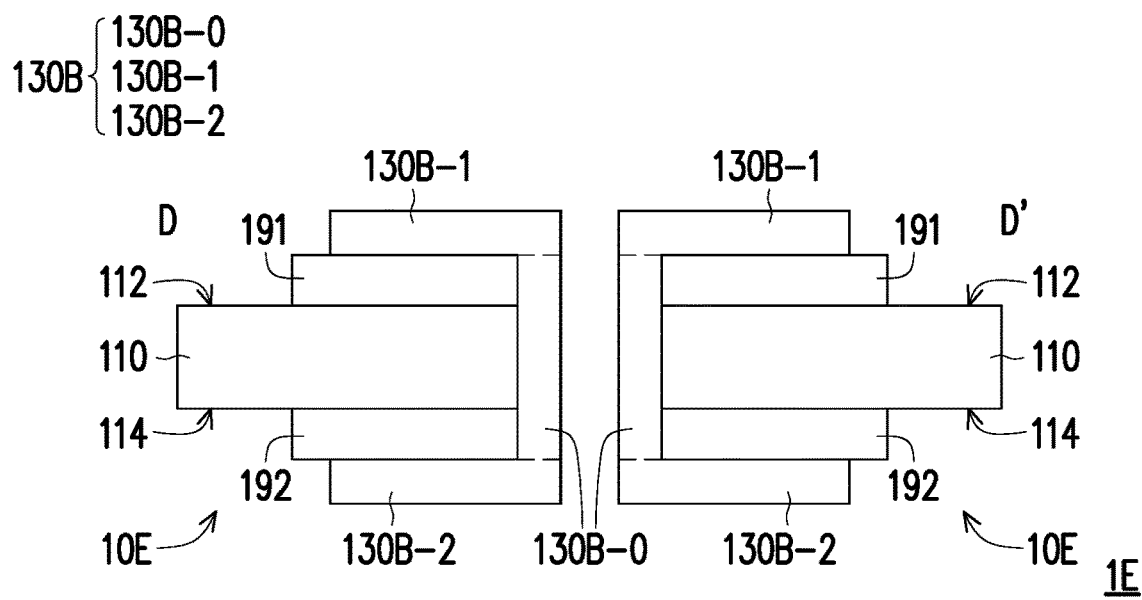
FIG. 19 is a schematic cross-sectional view of the spliced display device 1E according to an embodiment of the disclosure.

FIG. 19 is a schematic cross-sectional view of the spliced display device 1E according to an embodiment of the disclosure. FIG. 19 corresponds to a section line D-D' of FIG. 18.

The spliced display device 1E of FIG. 18 and FIG. 19 is similar to the spliced display device 1 of FIG. 13, and the difference between the two is that the peripheral region conductors 130B of the two are different.

Specifically, in the embodiment of FIG. 18 and FIG. 19, the peripheral region conductor 130B include not only a main portion 130B-0 disposed in a peripheral region through hole 116B, but also a first connection portion 130B-1 and a second connection portion 130B-2 respectively disposed on a first surface 112 and a second surface 114 of a substrate 110. The first connection portion 130B-1 is configured to be electrically connected to a conductive component 191 (for example, but not limited to: a metal pad) disposed on the first surface 112. The second connection portion 130B-2 is configured to be electrically connected to a conductive component 192 (for example, but not limited to: a metal pad) disposed on the second surface 114. In addition, in the embodiment of FIG. 18 and FIG. 19, each peripheral region conductor 130B is retracted in the corresponding peripheral region through hole 116B, and multiple peripheral region through holes 116B of two adjacent pixel array substrates 10E may be correspondingly disposed.

Figure 20:
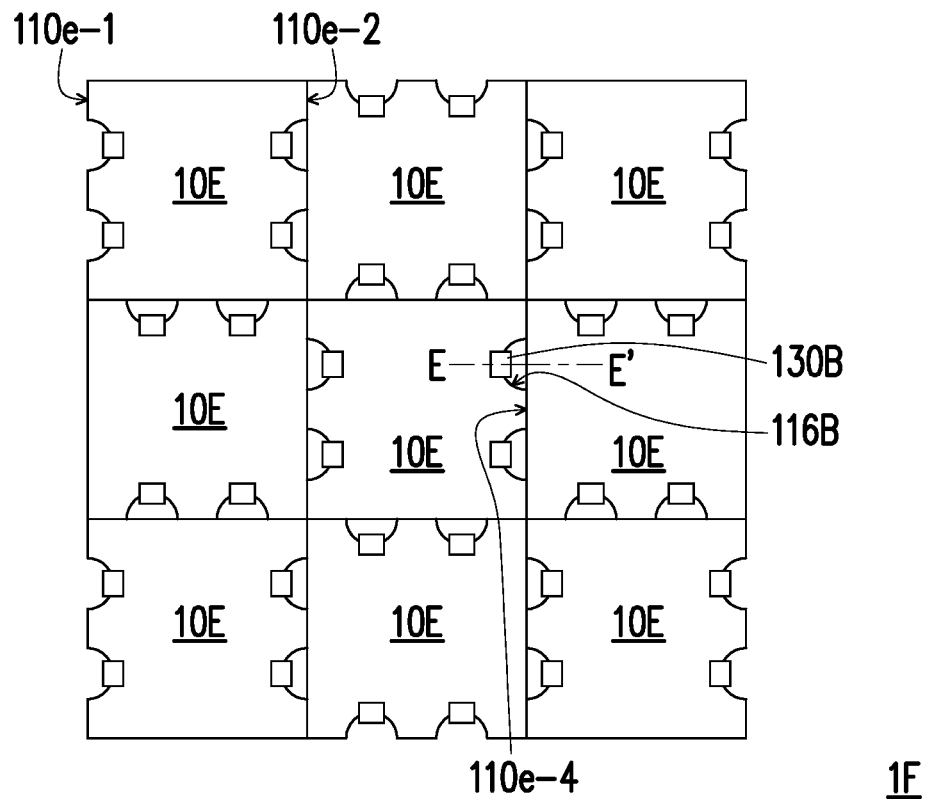
FIG. 20 is a schematic top view of a spliced display device 1F according to an embodiment of the disclosure.

FIG. 20 is a schematic top view of a spliced display device 1F according to an embodiment of the disclosure.

Figure 21:
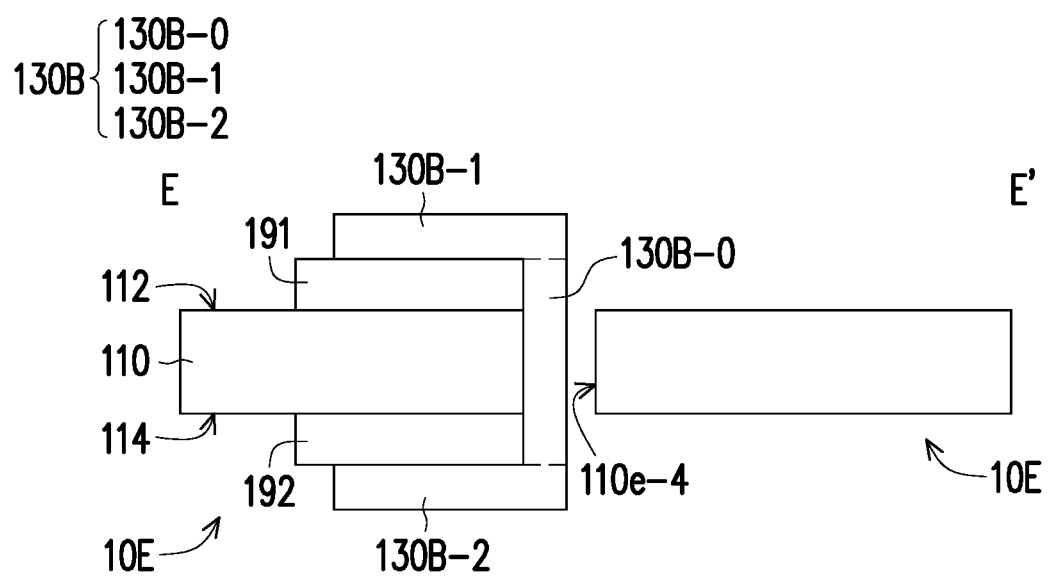
FIG. 21 is a schematic cross-sectional view of the spliced display device 1F according to an embodiment of the disclosure.

FIG. 21 is a schematic cross-sectional view of the spliced display device 1F according to an embodiment of the disclosure. FIG. 21 corresponds to a section line E-E' of FIG. 20.

The splicing display device 1F of FIG. 20 and FIG. 21 is similar to the splicing display device 1E of FIG. 18 and FIG. 19, and the difference between the two is that the splicing manners of the two are different.

Specifically, in the embodiment of FIG. 18 and FIG. 19, multiple peripheral region through holes 116B of one pixel array substrate 10E may correspond to multiple peripheral region through holes 116B of another pixel array substrate 10E. In the embodiment of FIG. 20 and FIG. 21, multiple peripheral region through holes 116B of each pixel array substrate 10E may correspond to an edge 110e-4 of another pixel array substrate 10E without the peripheral region through holes 116B.

Figure 22:
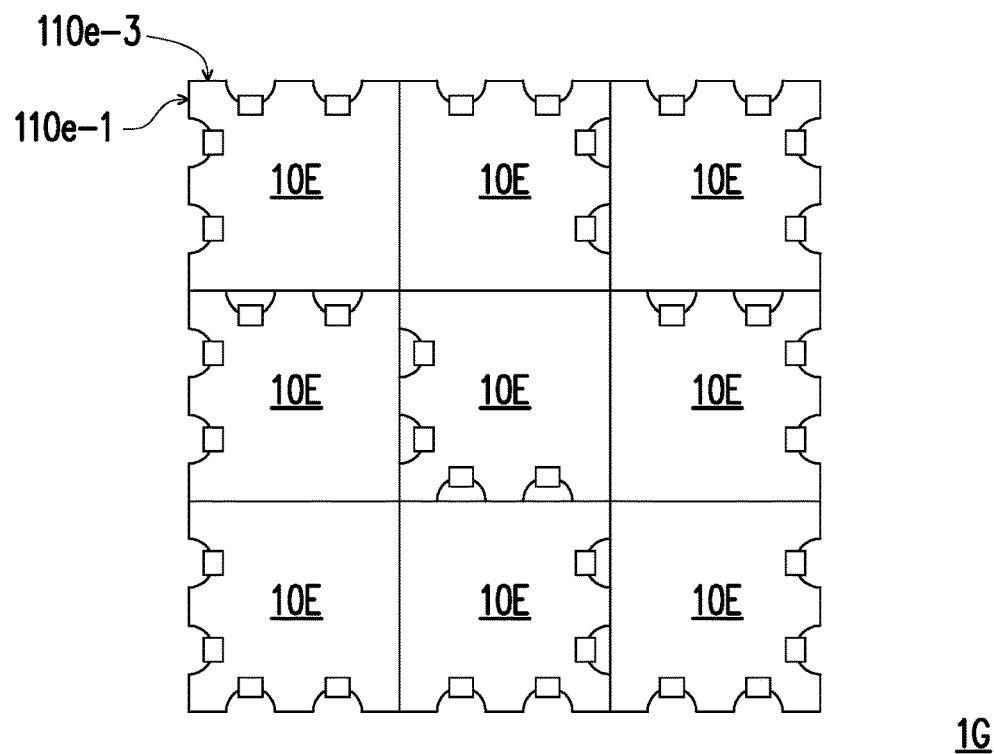
FIG. 22 is a schematic cross-sectional view of a spliced display device 1G according to an embodiment of the disclosure.

FIG. 22 is a schematic cross-sectional view of a spliced display device 1G according to an embodiment of the disclosure.

The spliced display device 1G of FIG. 22 is similar to the spliced display device 1F of FIG. 20, and the difference between the two is that in the embodiment of FIG. 20, the peripheral region conductors 130B are disposed on two opposite edges 110e-1 and 110e-2 of a substrate 110; and in the embodiment of FIG. 22, peripheral region conductors 130B are disposed on two adjacent edges 110e-1 and 110e-3 of a substrate 110.

Figure 23:
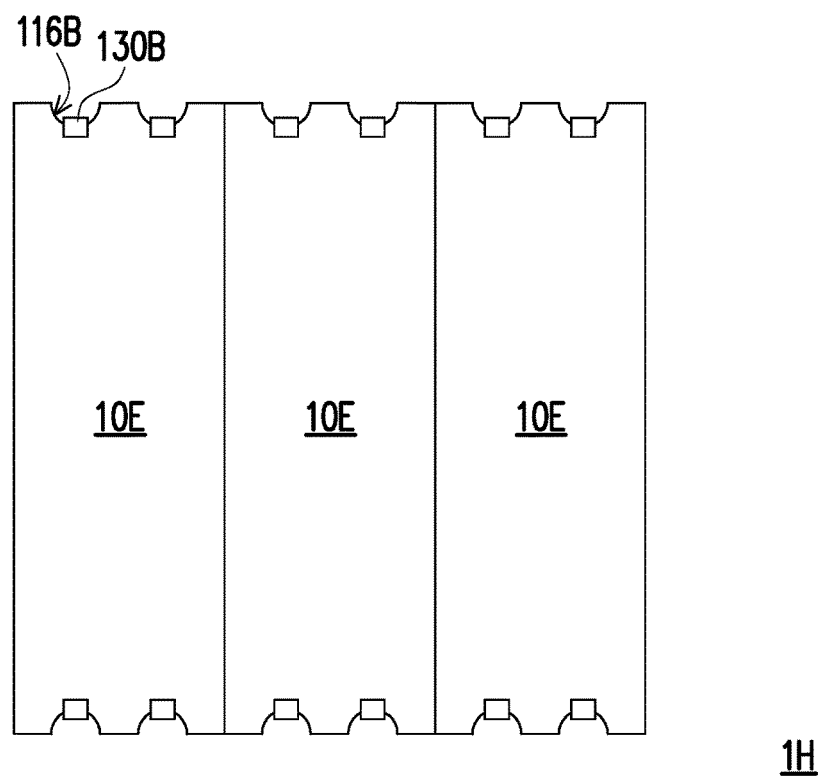
FIG. 23 is a schematic cross-sectional view of a spliced display device 1H according to an embodiment of the disclosure.

FIG. 23 is a schematic cross-sectional view of a spliced display device 1H according to an embodiment of the disclosure.

The spliced display device 1H of FIG. 23 is similar to the spliced display device 1E of FIG. 18, and the difference between the two is that the shape (for example, but not limited to: a rectangle) of a pixel array substrate 10E configured to be spliced into the spliced display device 1H of FIG. 23 is different from the shape (for example, but not limited to: a square) of the pixel array substrate 10E configured to be spliced into the display device 1 of FIG. 18.

Figure 24:
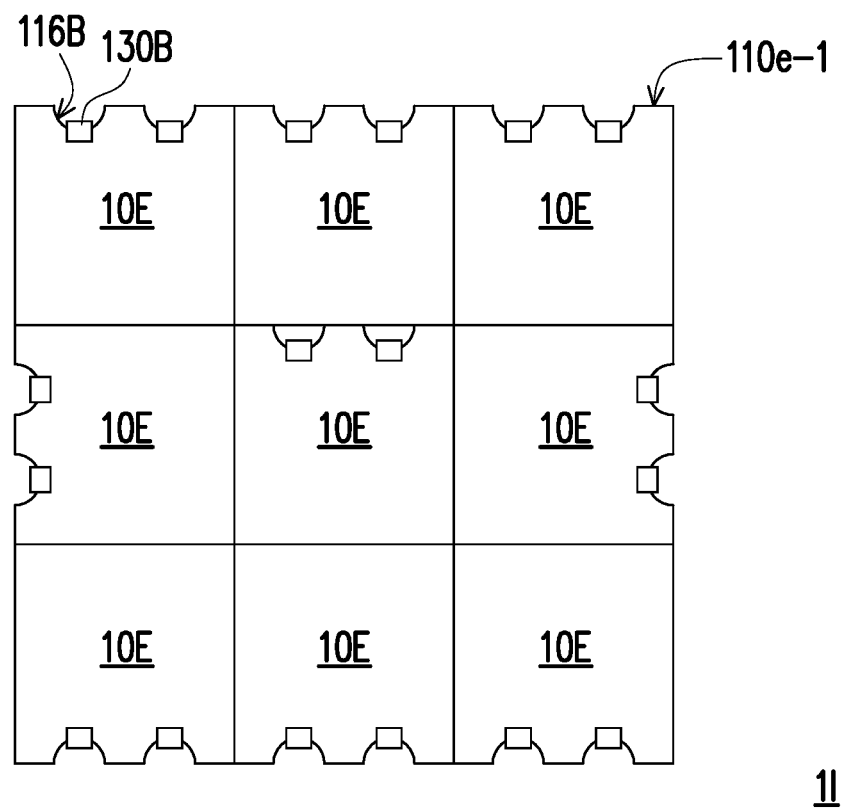
FIG. 24 is a schematic cross-sectional view of a spliced display device 1I according to an embodiment of the disclosure.

FIG. 24 is a schematic cross-sectional view of a spliced display device 1I according to an embodiment of the disclosure.

The spliced display device 1I of FIG. 24 is similar to the spliced display device 1E of FIG. 18, and the difference between the two is that in the embodiment of FIG. 18, the peripheral region conductors 130B are disposed on the two opposite edges 110e-1 and 110e-2 of the substrate 110; and in the embodiment of FIG. 24, peripheral region conductors 130B are disposed on a single edge 110e-1 of a substrate 110.

What is claimed is:

1. A pixel array substrate, comprising:
   a substrate, having a first surface, a second surface, and a plurality of through holes, wherein the first surface is opposite to the second surface, and the through holes extend from the first surface to the second surface;
   a plurality of conductors, respectively disposed in the through holes;
   a pixel driving circuit, disposed on the first surface of the substrate;
   a first pad and a second pad, disposed on the second surface of the substrate, wherein the conductors comprise:
     at least one first conductor, electrically connected to the pixel driving circuit and the first pad;
     a second conductor, electrically connected to the pixel driving circuit and the second pad; and
     a first dummy conductor, overlapping with and electrically isolated from the pixel driving circuit.

2. The pixel array substrate according to claim 1, wherein the pixel driving circuit comprises a thin film transistor, and the first dummy conductor overlaps with a channel of the thin film transistor.

3. The pixel array substrate according to claim 2, further comprising:
a first dielectric layer, disposed between the thin film transistor and the first surface of the substrate, wherein the first dielectric layer has a contact window overlapping with the at least one first conductor, a first terminal of the thin film transistor is electrically connected to the at least one first conductor through the contact window, and a physical portion of the first dielectric layer is disposed between the channel of the thin film transistor and the first dummy conductor.

4. The pixel array substrate according to claim 1, wherein the pixel driving circuit comprises a thin film transistor, and the first dummy conductor overlaps with a control terminal of the thin film transistor.

5. The pixel array substrate according to claim 4, further comprising:
a first dielectric layer, disposed between the thin film transistor and the first surface of the substrate, wherein the first dielectric layer has a contact window overlapping with the at least one first conductor, a first terminal of the thin film transistor is electrically connected to the at least one first conductor through the contact window, and a physical portion of the first dielectric layer is disposed between the control terminal of the thin film transistor and the first dummy conductor.

6. The pixel array substrate according to claim 1, further comprising:
a light-emitting diode element, disposed on the second surface of the substrate, wherein a first electrode and a second electrode of the light-emitting diode element are respectively electrically connected to the first pad and the second pad, and the light-emitting diode element has a region located between the first electrode and the second electrode; and
the conductors further comprise a second dummy conductor, overlapping with the region of the light-emitting diode element and electrically isolated from the pixel driving circuit and the light-emitting diode element.

7. The pixel array substrate according to claim 1, further comprising:
a light-emitting diode element, disposed on the second surface of the substrate, wherein a first electrode and a second electrode of the light-emitting diode element are respectively electrically connected to the first pad and the second pad; and
a common line, comprising:
a first portion, disposed on the first surface of the substrate; and
a second portion, disposed on the second surface of the substrate and electrically connected to the second pad, wherein
the pixel driving circuit comprises the first portion of the common line, and the second conductor is electrically connected to the first portion and the second portion of the common line; and
the conductors further comprise a third dummy conductor, overlapping with and electrically isolated from the first portion and the second portion of the common line.

8. The pixel array substrate according to claim 7, wherein a film thickness of the second portion of the common line is greater than a film thickness of the first portion of the common line.

9. The pixel array substrate according to claim 1, wherein the pixel driving circuit comprises a thin film transistor, the pixel array substrate further comprising:

a signal line, comprising:
a first portion, disposed on the first surface of the substrate and electrically connected to a second terminal of the thin film transistor, wherein the pixel driving circuit comprises the first portion of the signal line; and
a second portion, disposed on the second surface of the substrate, wherein
the conductors further comprise:
a third conductor, electrically connected to the first portion and the second portion of the signal line; and
a fourth dummy conductor, overlapping with and electrically isolated from the first portion and the second portion of the signal line.

10. The pixel array substrate according to claim 9, wherein a film thickness of the second portion of the signal line is greater than a film thickness of the first portion of the signal line.

11. The pixel array substrate according to claim 9, wherein a line width of the second portion of the signal line is greater than a line width of the first portion of the signal line.

12. The pixel array substrate according to claim 1, wherein the pixel driving circuit comprises a thin film transistor, the pixel array substrate further comprising:
a first dielectric layer, disposed on the first surface of the substrate and located between the thin film transistor and the first surface of the substrate; and
a first conductive pattern, disposed on the first surface of the substrate and located between the first dielectric layer and the first surface of the substrate, wherein
a first terminal of the thin film transistor is electrically connected to the first conductive pattern, the at least one first conductor is a plurality of first conductors, and the first conductive pattern is electrically connected to the first conductors.

13. The pixel array substrate according to claim 1, further comprising:
a heat-dissipation pattern, disposed on the second surface of the substrate and connected to the first dummy conductor.

14. The pixel array substrate according to claim 1, wherein the substrate has an active region and a peripheral region outside the active region, the pixel driving circuit is disposed in the active region of the substrate, the conductors comprise a plurality of active region conductors located in the active region and a plurality of peripheral region conductors located in the peripheral region, the active region conductors comprise the at least one first conductor, the second conductor, and the first dummy conductor, a reference surface is coplanar with the first surface of the substrate, and a vertical projection shape of one of the active region conductors on the reference surface is different from a vertical projection shape of one of the peripheral region conductors on the reference surface.

15. The pixel array substrate according to claim 1, wherein the substrate has an active region and a peripheral region outside the active region, the pixel driving circuit is disposed in the active region of the substrate, the conductors comprise a plurality of active region conductors located in the active region and a plurality of peripheral region conductors located in the peripheral region, the active region conductors comprise the at least one first conductor, the second conductor, and the first dummy conductor, a reference surface is coplanar with the first surface of the substrate, the active region conductors are arranged at a first spacing in a direction, the peripheral region conductors are arranged at a second spacing in the direction, and the first spacing is different from the second spacing.

16. The pixel array substrate according to claim 1, wherein the substrate has an active region and a peripheral region outside the active region, the pixel driving circuit is disposed in the active region of the substrate, the through holes comprise a plurality of active region through holes located in the active region and a plurality of peripheral region through holes located in the peripheral region, one of the active region through holes is a closed opening, and one of the peripheral region through holes is an opened opening.

17. The pixel array substrate according to claim 1, wherein the substrate has an active region and a peripheral region outside the active region, the pixel driving circuit is disposed in the active region of the substrate, the through holes comprise a plurality of active region through holes located in the active region and a plurality of peripheral region through holes located in the peripheral region, the conductors comprise a plurality of active region conductors and a plurality of peripheral region conductors respectively located in the active region through holes and the peripheral region through holes, the active region conductors comprise the at least one first conductor, the second conductor, and the first dummy conductor, and one of the peripheral region conductors is retracted in a corresponding one of the peripheral region through holes.

18. The pixel array substrate according to claim 1, wherein the substrate has an active region and a peripheral region outside the active region, the through holes comprise a plurality of active region through holes located in the active region and a plurality of peripheral region through holes located in the peripheral region, the conductors comprise a plurality of active region conductors and a plurality of peripheral region conductors respectively located in the active region through holes and the peripheral region through holes, and the active region conductors comprise the at least one first conductor, the second conductor, and the first dummy conductor; and the substrate has a plurality of concave surfaces and a plurality of outer sidewalls, the concave surfaces respectively define the peripheral region through holes of the substrate, each of the outer sidewalls is connected between adjacent two of the concave surfaces, and the concave surfaces and the outer sidewalls of the substrate jointly define an edge of the substrate; and
  one of the peripheral region conductors has a surface, the surface faces away from a corresponding one of the concave surfaces of the substrate, and there is a distance between the surface of the peripheral region conductor and one of the outer sidewalls of the substrate.

19. The pixel array substrate according to claim 18, wherein the surface of the peripheral region conductor is substantially a flat surface.

20. The pixel array substrate according to claim 18, wherein the surface of the peripheral region conductor is a concave surface.

* * * * *